(12) United States Patent
Kitahara

(10) Patent No.: US 6,389,584 B1
(45) Date of Patent: May 14, 2002

(54) GATE INPUT PROTECTION WITH A REDUCED NUMBER OF ANTENNA DIODES

(75) Inventor: Takeshi Kitahara, Santa Clara, CA (US)

(73) Assignee: Hitachi Semiconductor (America), Inc., San Jose, CA (US)

( * ) Notice: Subject to any disclaimer, the term of this patent is extended or adjusted under 35 U.S.C. 154(b) by 0 days.

(21) Appl. No.: 09/358,943

(22) Filed: Jul. 22, 1999

(51) Int. Cl.[7] ............................................ G06F 17/50
(52) U.S. Cl. ............................ 716/13; 716/2; 716/11
(58) Field of Search ............................ 716/1, 2, 4, 5, 716/8, 9, 10, 11, 12, 13, 14

(56) References Cited

U.S. PATENT DOCUMENTS 5,966,517 A * 10/1999 Cronin, III et al. ............ 716/1

* cited by examiner

Primary Examiner—Matthew Smith
Assistant Examiner—Leigh Marie Garbowski
(74) Attorney, Agent, or Firm—Sqire, Sanders & Dempsey LLP

(57) ABSTRACT

Antenna diodes reduction. The number of antenna diodes is reduced in order to achieve an improved integrated circuit (IC) performance in terms of speed and power consumption. Essentially, before the number of antenna diodes can be reduced interconnect segments at a metal layer and metal layers below it are checked to find out if there are any segments of interconnects to gate inputs that are not yet connected to an output of a signal source. Further, a ratio is established for each segment of interconnect to gate input(s) that is not yet connected to an output. The ratio relates to the physical characteristics of the gate and interconnect and is expressed as the relationship between the gate area and area of the interconnect segments that are not yet connected to the signal source. The ratio is then compared against a set criteria such as an upper limit of the ratio. Finally, based on this comparison and the number of gate inputs attached to the interconnect, a decision is made whether to reduce the number of antenna diodes. Once a decision is made, the number of antenna diodes is adjusted accordingly by removing antenna diodes or by reducing the number of antenna diodes to be added. In accordance with a purpose of the invention, a computer system can be used in which an embodiment of the invention is implemented. The invention can be implemented in the computer system as a separate design automation tool or as part of other design automation tools. The invention can be embodied in the computer system in the form of computer program code stored in a computer readable medium.

43 Claims, 21 Drawing Sheets

1) CIRCUIT DESIGN (DIGITAL)
2) BLOCK-LEVEL PHYSICAL DATA GENERATION
3a) REMOVE UNECESSARY DIODES
3b) ADD NECESSARY DIODES

COMPUTER GEOMETRICAL OPERATIONS

GATE INPUT PROTECTION WITH A REDUCED NUMBER OF ANTENNA DIODES

FIELD OF THE INVENTION

This application relates to integrated circuit (IC) design automation and, more specifically, to gate input protection design.

A conventional approach to designing an IC consists of assembling the IC using standard of-the-shelf IC elements known as cells. Cells are also referred to as logic gates or gates. Automated IC design makes use of a library, table or database of cells (hereafter collectively referred to as the "cell library"). The structure of IC elements, including MOS devices, is determined by the contents of cells suitably selected from the cell library. Devices such as NMOS (n-type MOS), PMOS (P-type MOS), MOSFET (MOS field effect transistor), CMOS (complimentary MOS), etc., are collectively referred to herein as the MOS devices. Moreover, ICs that include MOS devices are known as MOS ICs or, simply, ICs (hereafter, ICs).

To illustrate the structure of MOS devices in ICs, FIGS. 1a and 1b, show a somewhat simplified cross section of an IC 1 with a MOS transistor 10 or 20. The MOS transistor 10 in FIG. 1a is a p-channel transistor. The MOS transistor 20 in FIG. 1b is an n-channel transistor. The MOS transistors 10 and 20 are shown as being produced in lightly doped p-type and n-type silicon substrates 12 and 22, respectively. A typical MOS transistor includes source, drain and channel regions, as well as a gate separated from these regions by a thin layer of (dielectric) insulation.

Hence, as is further shown, for each of the MOS transistors 10 and 20, two heavily doped n-type and p-type regions, respectively, are created in the substrate 12 and 22. The heavily doped regions in the MOS transistor 10 are indicated as n+ source 14a and n+ drain 14b. The heavily doped regions in the MOS transistor 20 are indicated as p+ source 24a and p+ drain 24b.

In MOS transistor 10, the channel 2 in the n-type substrate 12 between the source 14a and drain 14b is a region of p-type material. In MOS transistor 20, the channel 4 in the p-type substrate 22 between the source 24a and drain 24b is a region of n-type material. Through the channel 2 (and 4), a current of the majority of charge carriers flows from the source 14a (and 24a) to the drain 14b (and 24b).

In order to insulate the gate 16, as previously described, the gate 16 (and 26) is overlaid on a thin layer of insulating material 18 (and 28) that rests over the surface of the structure. The insulating material has dielectric properties. The thin layer of insulation is grown, for example, as a layer of silicon dioxide ($SiO_2$), and the gate area is formed from a metal such as polysilicon. The gate covers substantially the entire channel region.

Furthermore, holes or vias (not shown) are cut or etched into the thin layer of insulation to make room for metal contacts. The metal contacts, designated as S, G and D, provide electrical connections to the source 14a and 24a, drain 14b and 24b and gate 16 and 26, respectively.

As a result of their physical structure, MOS transistors exhibit certain inherent characteristics including a gate capacitance. More specifically, the metal area of the gate 16 and 26, in conjunction with the dielectric thin layer of insulation 18 and 28 and the channel, form a parallel plate capacitor. This capacitor is known as the gate capacitor. The insulation layer under the gate area 16 (and 26) is referred to as the gate oxide layer or, simply, gate oxide.

To illustrate the structure of a plurality of MOS devices in an IC, FIGS. 1c and 1d show a somewhat simplified cross section of ICs 100 and 200 with a plurality of MOS transistors 110, 120, 210 and 220, respectively. Each of the MOS transistors 110, 120, 210 and 220 is structured in a manner as explained above. In FIG. 1c, the MOS transistors 110 and 120 are constructed in a p-type substrate, where the p+ regions of the source 114a and drain 114b in MOS transistor 110 are diffused into an n-type well 118. Conversely, in FIG. 1d, the MOS transistors 210 and 220 are constructed in an n-type substrate, where the n+ regions of the source 224a and drain 224b in MOS transistor 210 are diffused into a p-type well 218.

Regions of insulation shown as the silicon dioxide ($SiO_2$) regions 128 (and 228) separate between adjacent MOS transistors. For example, insulation region 128b (and 228b) separates between adjacent MOS transistors 110 and 120 (and 210 and 220) in IC 100 (and 200). Moreover, for each MOS transistor, the metal area of the respective gates 116 and 126 (and 216 and 226), in conjunction with the dielectric thin layer of insulation 130 (and 230) and the channel (not shown), forms a parallel plate capacitor. For each MOS transistor, this capacitor is its gate capacitor, and the insulation layer 130 (and 230) under the gate area is its gate oxide layer or, simply, the gate oxide.

After assembling the thousands of unconnected cells for creating the IC, the interconnection of the cells can be achieved by a metallization process. Metallization includes the creation of a metal layer for interconnecting between the cells. A metal layer is made out of a conductive material (e.g., metal) according to a pattern specified to implement the particular IC function. In automated IC design, the metal layer pattern is created by routing that implements the specified IC function. The metal layer is processed according to the routed pattern. For example, in the production of CMOS devices, plasma etching techniques are used to produce the pattern on the metal layer.

Metal layers are individually created and then connections are made between them as needed. This allows interconnections defined by pattern of the various metal layers to carry signals to and from cells in similar or different levels. FIGS. 2a and 2b show a somewhat simplified diagram of an IC 300 with a plurality of partially connected MOS transistors 302 and 304.

Interconnects in one metal layer ($M_2$) 342 and 344 may be connected to several gate inputs 316 and 326 of MOS transistors 302 and 304 before connections between this ($M_2$) and other metal layers ($M_3$) 340 can be completed. Until the connections are completed, such gates remain open circuited and the interconnects that are attached to them behave as antennas. The antenna-behaving interconnects receive static charge from the surrounding environment when, for example, a next higher metal layer (M3) 340 is plasma-etched. It may be recalled that each gate is associated with a gate capacitor (not shown). For that reason, the static charge 350 is induced by the antenna-behaving interconnects at the respective gate inputs 316 and 326 as a collection of charges at their gate capacitors.

Charges 350 that accumulate in a gate capacitor can cause a gate-to-source voltage ($V_{GS}$) 360 and 370 to exceed a breakdown voltage. An accumulation of charges on an open-circuited gate may result in a large enough field to punch through the dielectric gate oxide. Since a gate oxide is extremely thin, it may easily be damaged by the excessive voltage. This effect is magnified as the length of interconnects increases.

As the density of MOS devices in IC increases, the structure of MOS devices gets smaller and, in turn, their respective gate oxide layers become even thinner. Moreover, to achieve higher performance and reduce power consumption, MOS devices, particularly CMOS devices, have been operating under lower supply voltage conditions and with smaller gate sizes. Hence the accumulation of charges due to the antenna behavior of the interconnects becomes more critical.

To prevent the accumulation of static charge in the gate capacitor of MOS devices, gate protection is usually included at the gate input of the MOS devices. The protection mechanism invariably makes use of clamping or antenna diodes (hereafter collectively referred to as antenna diodes). The function of the gate input protection is to limit the gate input voltage and prevent breakdown of the gate.

FIGS. 2c and 2d, illustrate a cross section of an IC 12 (and 22) with an antenna diode 18 connected at the gate input of MOS transistor 10 (and 20). The antenna diode prevents the gate-to-source voltage from exceeding the supply voltage by more than the diode-on voltage (i.e., $$V_{GS} \leq V_{DD} + V_D,$$

where $V_{GS}$ is the gate-to-source voltage, $V_{DD}$ is the supply voltage and $V_D$ is the diode-on voltage).

If the interconnect length could be controlled, a p-n or n-p junction diode could be added to each input. However, with automatic placement of cells and routing this approach is too difficult to control. Hence, in ICs the protection mechanism can be included in the cells. And, in order to prevent breakdown of MOS devices in an IC, the MOS devices are provided by selecting cells from the library that have the input protection devices.

FIGS. 3a–c illustrate an IC with an antenna diode connected at the gate input of each MOS transistor. In FIGS. 3a and 3b, the partially connected MOS transistors 302 and 304 and MOS transistor 306 which provides the signal (i.e., the signal source) are each configured with an antenna diode 308, 318 and 328 for gate input protection. As a further example, in FIG. 3c, the partially connected CMOS transistors 402 and 404 and CMOS transistor 406 of IC 400 are each provided with a pair of antenna diodes 408, 418 and 428 for gate input protection.

Having the diodes at each of the gate inputs in the IC protects the gates from breakdown but increases the input capacitance of MOS devices at the connection point to the respective interconnects. This reduces the overall IC performance because the signals carried by the interconnects encounter higher load capacitances and, in turn, longer charge time and lower overall speed.

Hence, a need exists for providing high performance ICs. A need further exists for providing ICs that, in addition to the high performance, are more reliable. The present invention addresses these and related problems.

SUMMARY OF THE INVENTION

The present invention provides gate input protection with a reduced number of antenna diodes. The number of antenna diodes can be reduced to a suitable minimum in order to achieve a higher speed. Minimizing the number of antenna diodes in an integrated circuit (IC) in accordance with the invention does not compromise gate input protection measures to prevent breakdown. Reducing the number of antenna diodes improves the overall performance of ICs also in terms of power consumption. Thus, an IC design that implements the present invention achieves higher performance and reliability.

Typically, an interconnect may have portions thereof placed in more than one metal layer. While the metal layers are not yet interconnected, all or parts (segments) of the interconnect are open and not yet connected to a signal source. The signal source can be external to or internal in the IC. An internal signal source can be, for example, an output of a gate. Hence, before a decision about reducing the number of antenna diodes is made a metal layer and metal layers below it are checked to find out if there are any segments of interconnects to gate inputs that are not yet connected to a signal source. Further, a ratio is established for each interconnect to a gate input that is not yet connected to the signal source. The ratio relates to the physical characteristics of the gate and interconnect and is expressed as the relationship between the areas of the gate and interconnect. The ratio is then compared to an upper limit. Finally, based on this comparison and the number of gate inputs attached to the interconnect segments, a decision is made whether to reduce the number of antenna diodes that are either already present or to be later added. Once a decision is made, the number of antenna diodes that are associated with gate inputs is adjusted accordingly by removing or adding less antenna diodes.

In accordance with a purpose of the invention, a computer system can be used in which an embodiment of the invention is implemented. The embodiment can be implemented in the computer system as a separate design automation tool or as part of other design automation tools. The invention can be embodied in the computer system in the form of computer program code stored in a computer readable medium.

Thus, in accordance with the purpose of the invention, as embodied and broadly described herein, the invention relates to a method for reducing the number of antenna diodes for gate input protection in the IC. In further accordance with the purpose of the invention, as embodied and broadly described herein, the invention relates to a computer readable medium embodying computer program code configured to cause a computer system to perform steps for reducing the number of antenna diodes.

In further accordance with the purpose of the invention, as embodied and broadly described herein, the invention also related to a system for reducing the number of antenna diodes. The system includes a processor and a storage medium embodying computer program code executed by the processor. The storage medium includes a circuit design engine, a physical data generator, and a diodes number minimizing engine capable of performing steps for minimizing the number of antenna diodes, as detailed below.

In further accordance with the purpose of the invention, as embodied and described herein, the invention additionally relates to an IC. The IC includes gate inputs. Interconnects routed in one or more metal layers of the IC are attached to at least one of the gate inputs. Gate inputs protection in the IC is designed with a reduced number of antenna diodes provided by a diodes number reduction engine. The diodes number reduction engine is capable of performing steps as hereafter described. The gate inputs are provided by a circuit design engine, physical data generator and placement tool. The interconnects are routed by a placement and routing tool.

The steps include selecting a segment of an interconnect routed in a metal layer of an IC and metal layers below the metal layer, and determining whether the selected interconnect segment is attached to any gate input and, if so, further determining whether the selected interconnect is connected to a signal source. The steps further include determining if the selected interconnect segment is at the lowest metal layer for the routed interconnect and, if so, reducing to zero the number of antenna diodes associated with each gate input that is attached to the selected interconnect segment if, in addition, the selected interconnect is already connected to a signal source. The steps additionally include determining whether to adjust the number of antenna diodes associated with gate inputs that are attached to the selected interconnect segment if the selected interconnect segment is not yet connected to the signal source.

The determination of whether to adjust the number of antenna diodes includes determining an interconnect area, determining a gate area, determining a ratio between the interconnect area and the gate area, determining, based on criteria, whether to adjust the number of antenna diodes and, finally, reducing the number of antenna diodes if it is so determined.

The steps are suitably performed with any gate input configuration and, particularly, when, of the gate inputs that are attached to the selected interconnect segment, at least one gate input is initially configured with an associated antenna diode, wherein the number of antenna diodes is reduced by removing antenna diodes. Likewise, the steps are suitably performed when the gate inputs that are attached to the selected interconnect segment are initially configured without an associated antenna diode, wherein an antenna diode can be added to each corresponding gate input configuration, and wherein the number of antenna diodes is reduced by reducing the number of added antenna diodes.

The foregoing steps are followed by additional steps that include, one at a time until all interconnect segments of the routed interconnect have been selected, selecting an additional segment and repeating the forgoing steps for each segment. Moreover, the additional steps include selecting, one at a time, additional routed interconnects for the particular signal route, and repeating the foregoing steps for each of the selected routed interconnects. Finally, if more signal routes remain to be examined, one at a time, each of these signal routes is treated as in the foregoing steps. In other words, each signal route is examined individually, the interconnects of each signal route are examined individually and, in turn, the segments of each interconnect are examined individually.

For each next selected segment, the additional steps includes reducing to zero the number of antenna diodes associated with each gate input that is attached to the next selected segment if the next selected segment is connected to any signal source and is at the lowest metal layer of the routed interconnect. The additional steps further include determining whether to adjust the number of antenna diodes associated with gate inputs that are attached to the next selected segment if the next selected segment is not yet connected to any signal source.

Advantages of the invention will be set forth, in part, in the description that follows and, in part, will be understood by those skilled in the art from the description herein. The advantages of the invention will be realized and attained by means of the elements and combinations particularly pointed out in the appended claims and equivalents.

BRIEF DESCRIPTION OF THE DRAWINGS

The accompanying drawings, which are incorporated in and constitute a part of this specification, illustrate several embodiments of the invention and, together with the description, serve to explain the principles of the invention.

FIG. 6b is diagram of an IC being produced in accordance with the flow diagram of FIG. 6a.

DETAILED DESCRIPTION OF A PREFERRED EMBODIMENT

The present invention provides gate input protection with a reduced number of antenna diodes. The number of antenna diodes is minimized albeit taking gate input protection measures to prevent breakdown. An integrated circuit (IC) design that implements the present invention achieves higher performance and reliability. Reducing to a minimum the number of antenna diodes increases the overall performance of ICs because fewer diodes means fewer capacitive loads and faster response time.

Reference will now by made in detail to preferred embodiments of the invention, examples of which are illustrated in the accompanying drawings. Wherever convenient, the same reference numbers will be used throughout the drawings to refer to the same or like parts.

General Principles Of The Invention

Figure 1A:
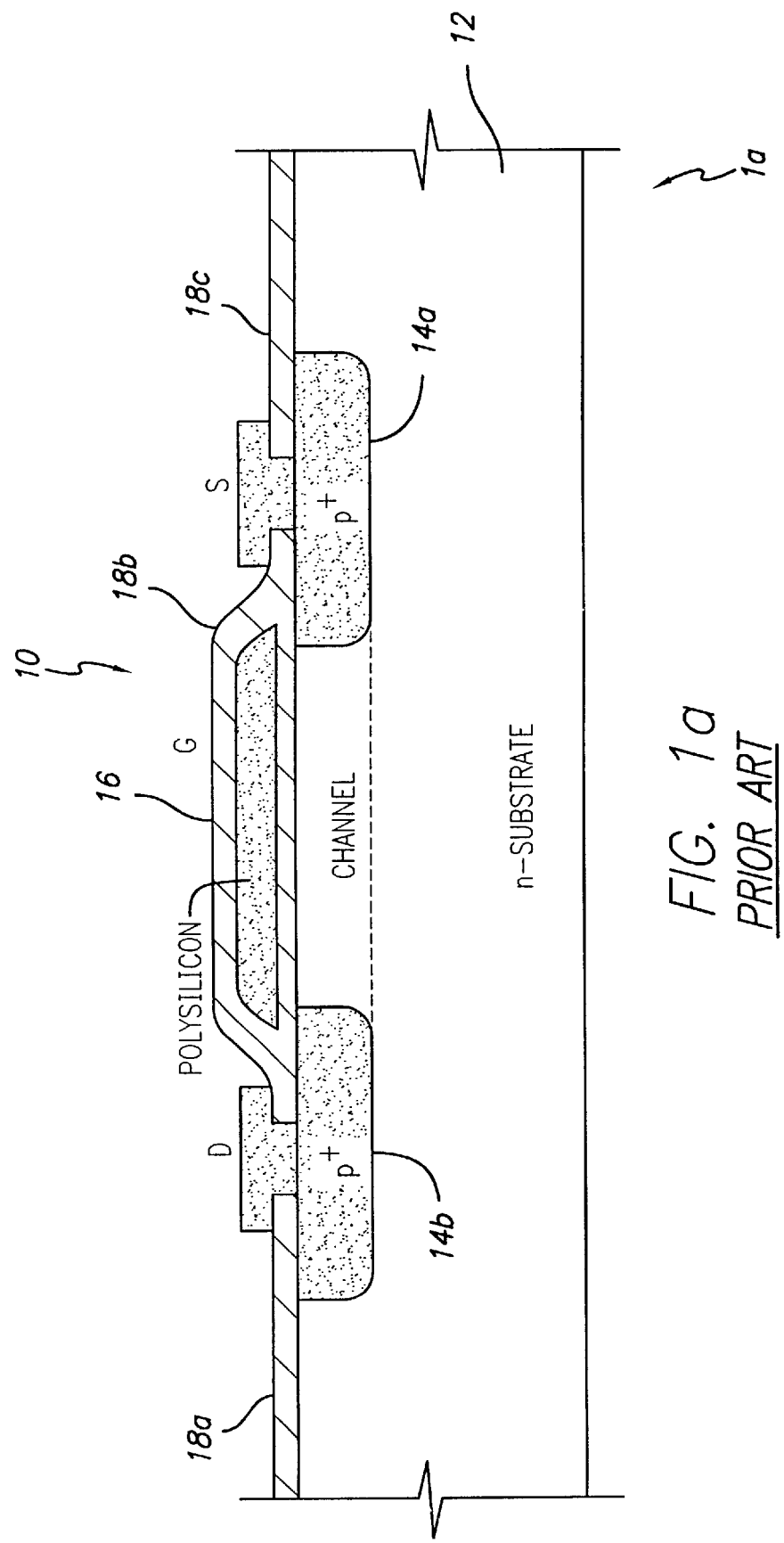
FIGS. 1a and 1b, each shows a cross section of an IC (integrated circuit) with a MOS (metal oxide semiconductor) transistor.
Figure 1B:
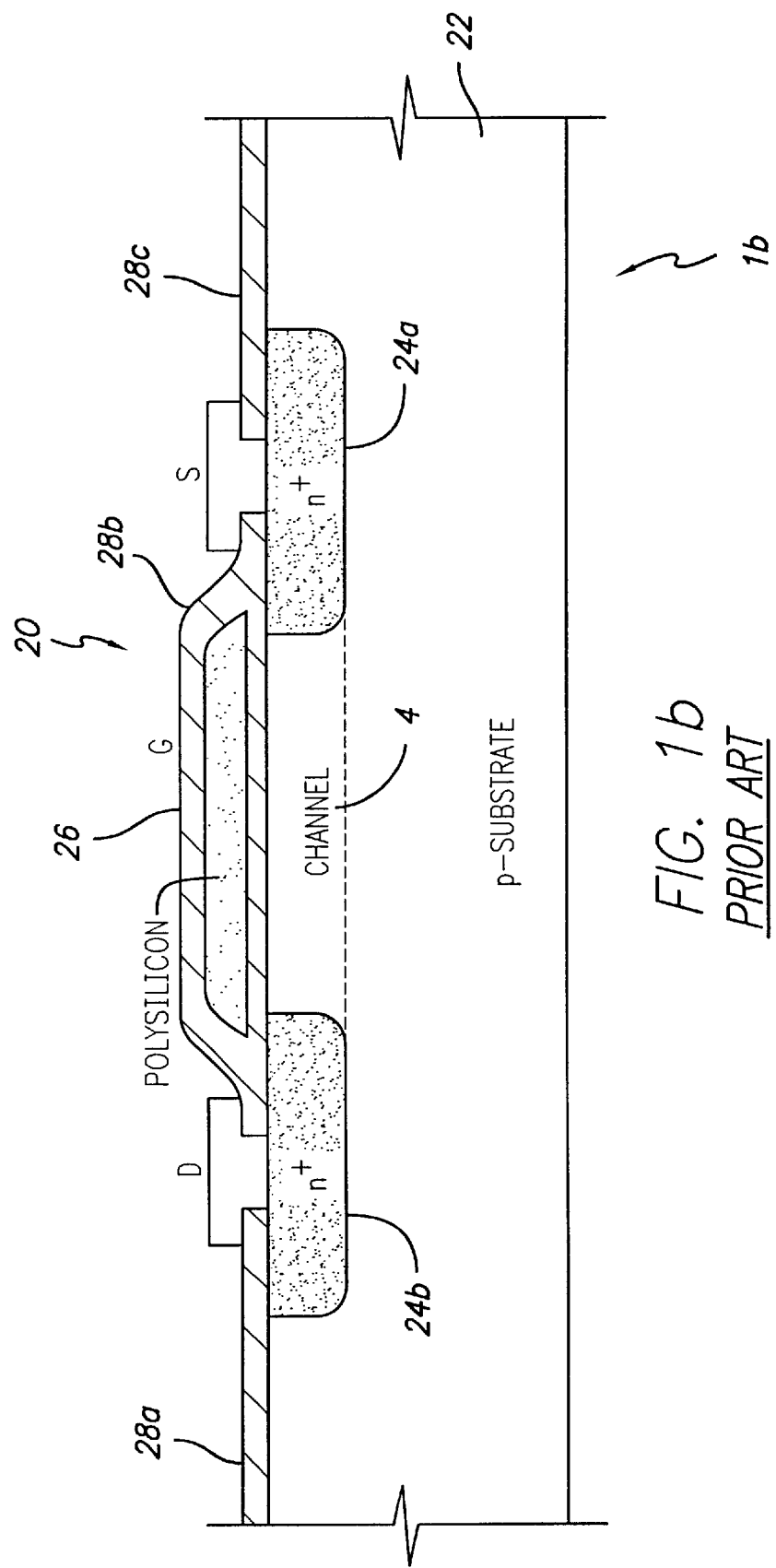
Figure 1C:
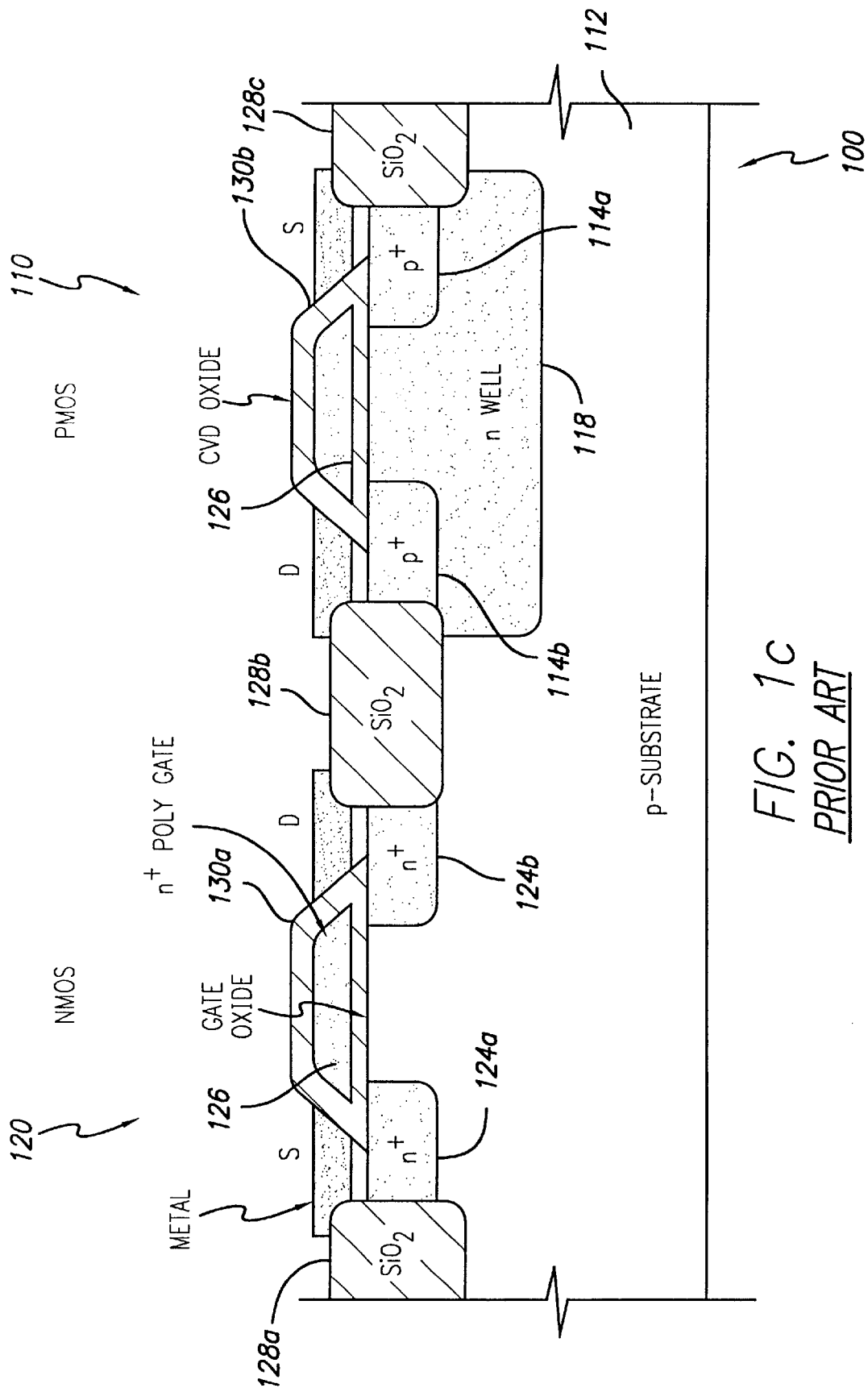
FIGS. 1c and 1d, each shows a cross section of ICs with a plurality of MOS transistors.
Figure 1D:
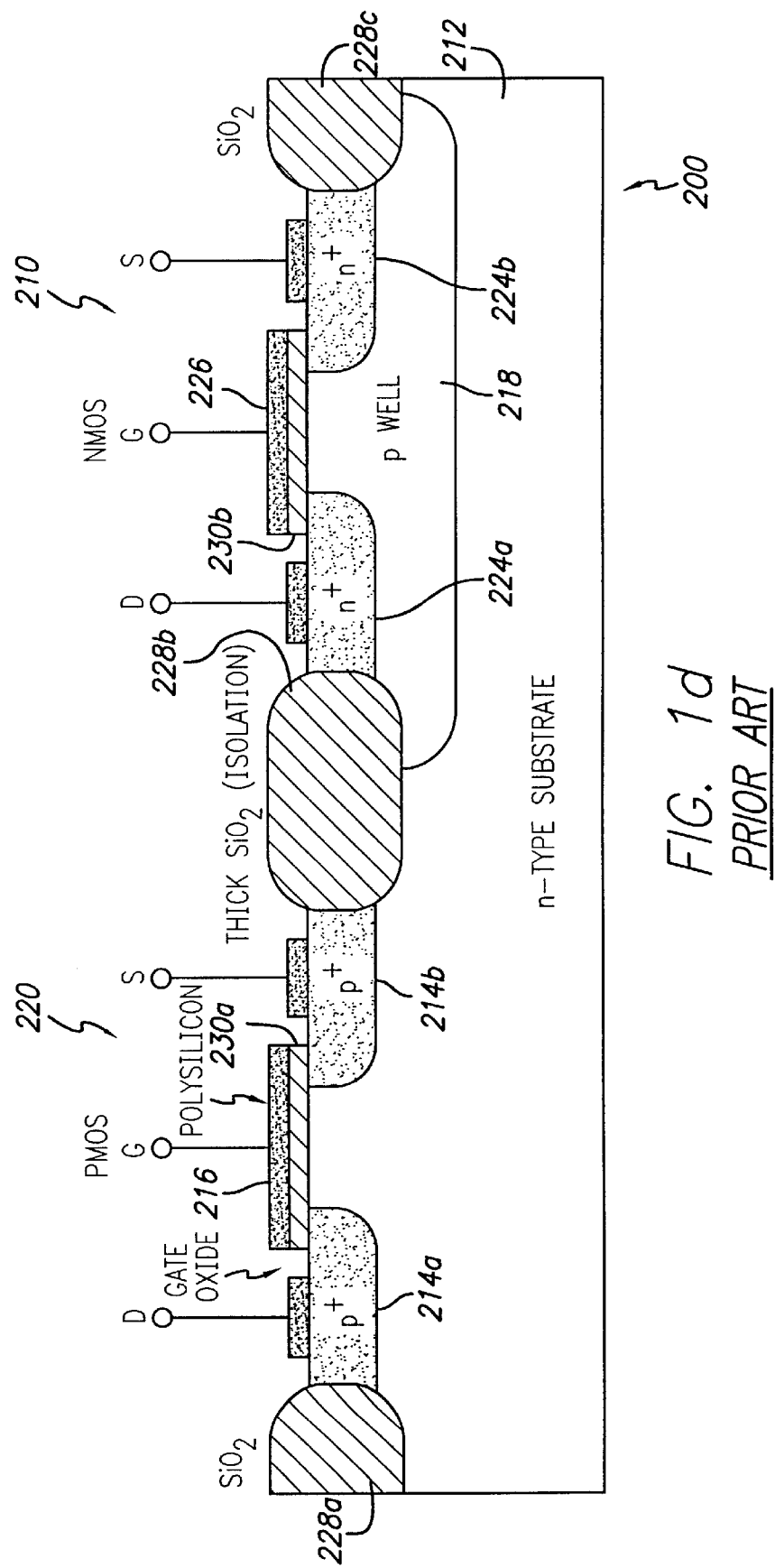
Figure 2A:
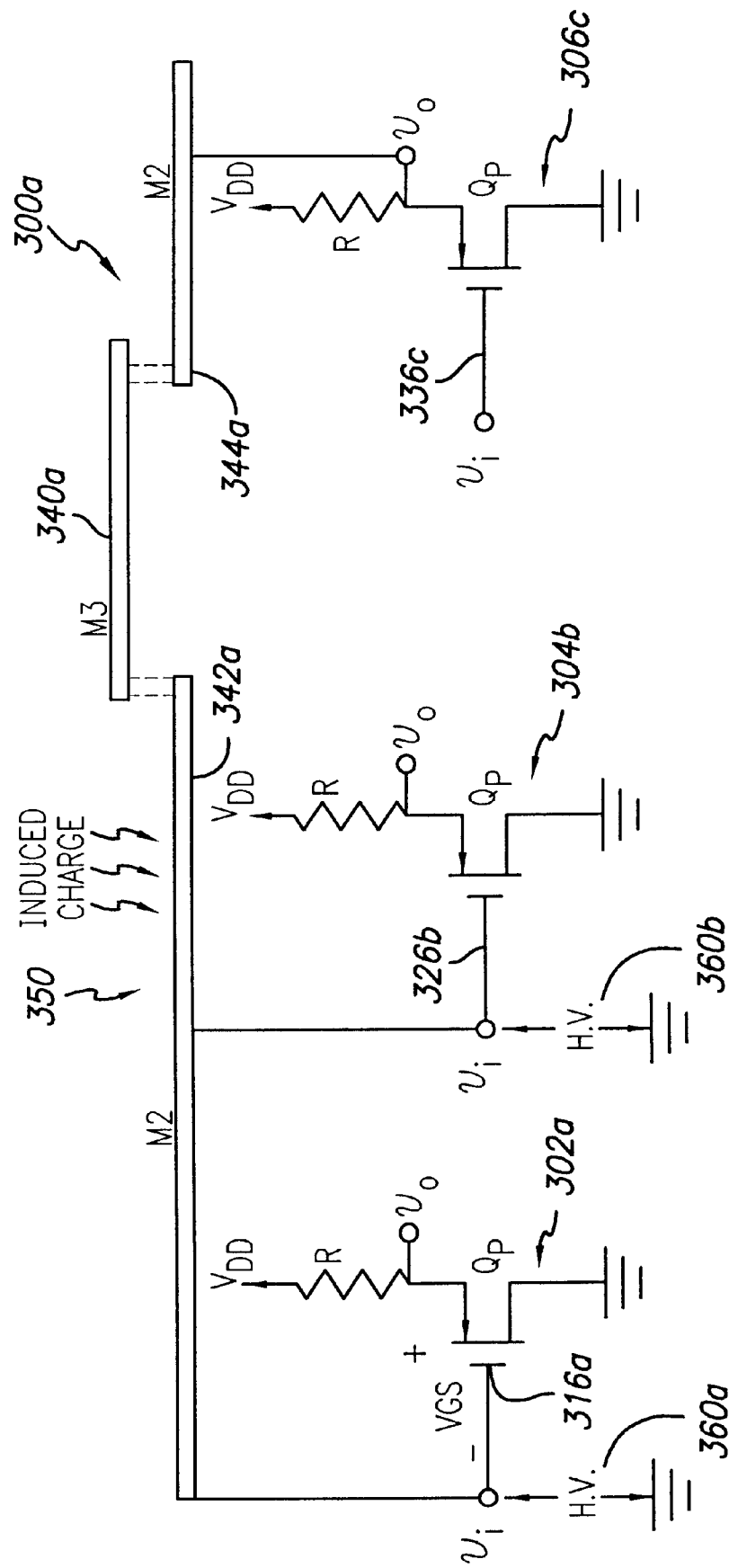
FIGS. 2a and 2b each shows a diagram of an IC with a plurality of partially connected MOS transistors.
Figure 2B:
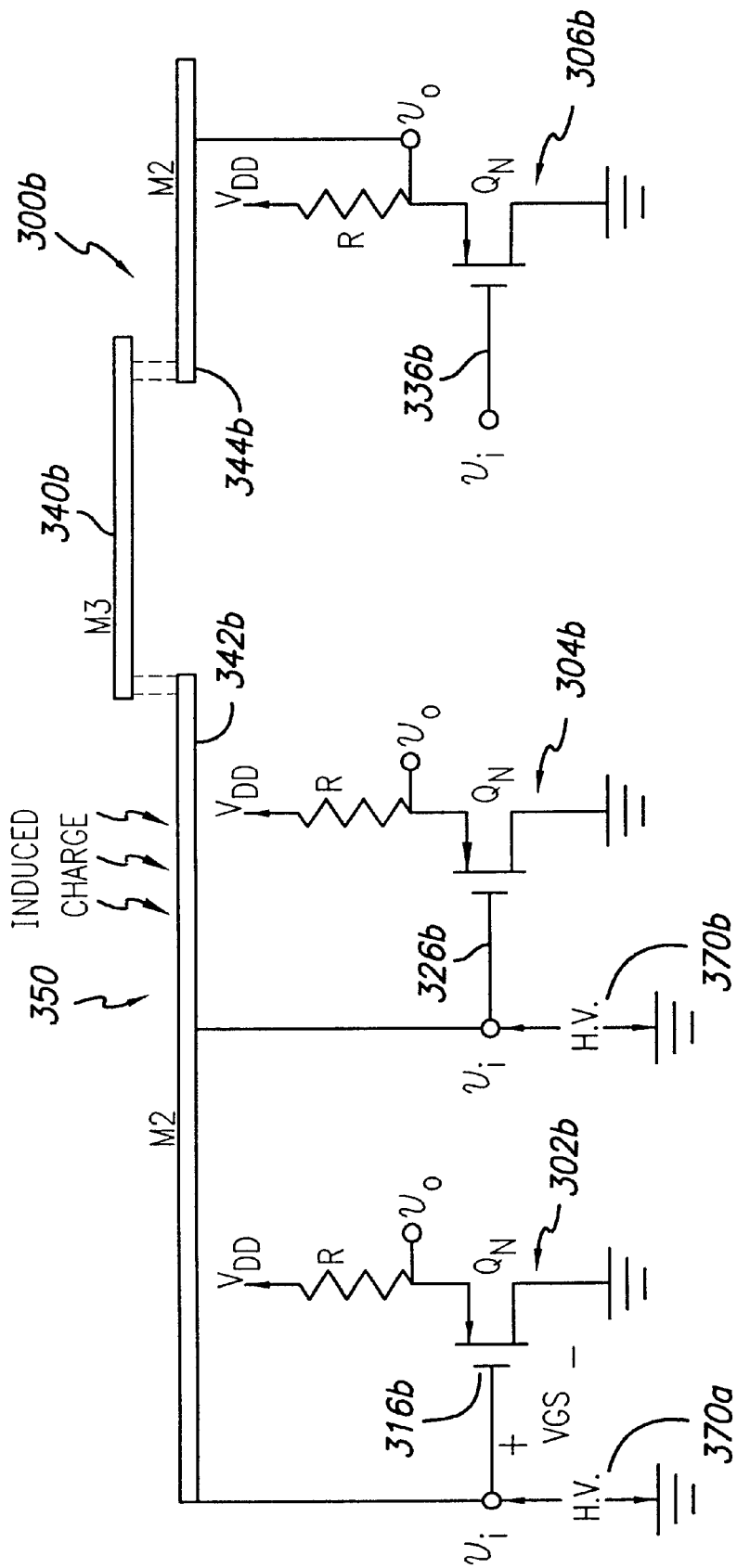
Figure 2C:
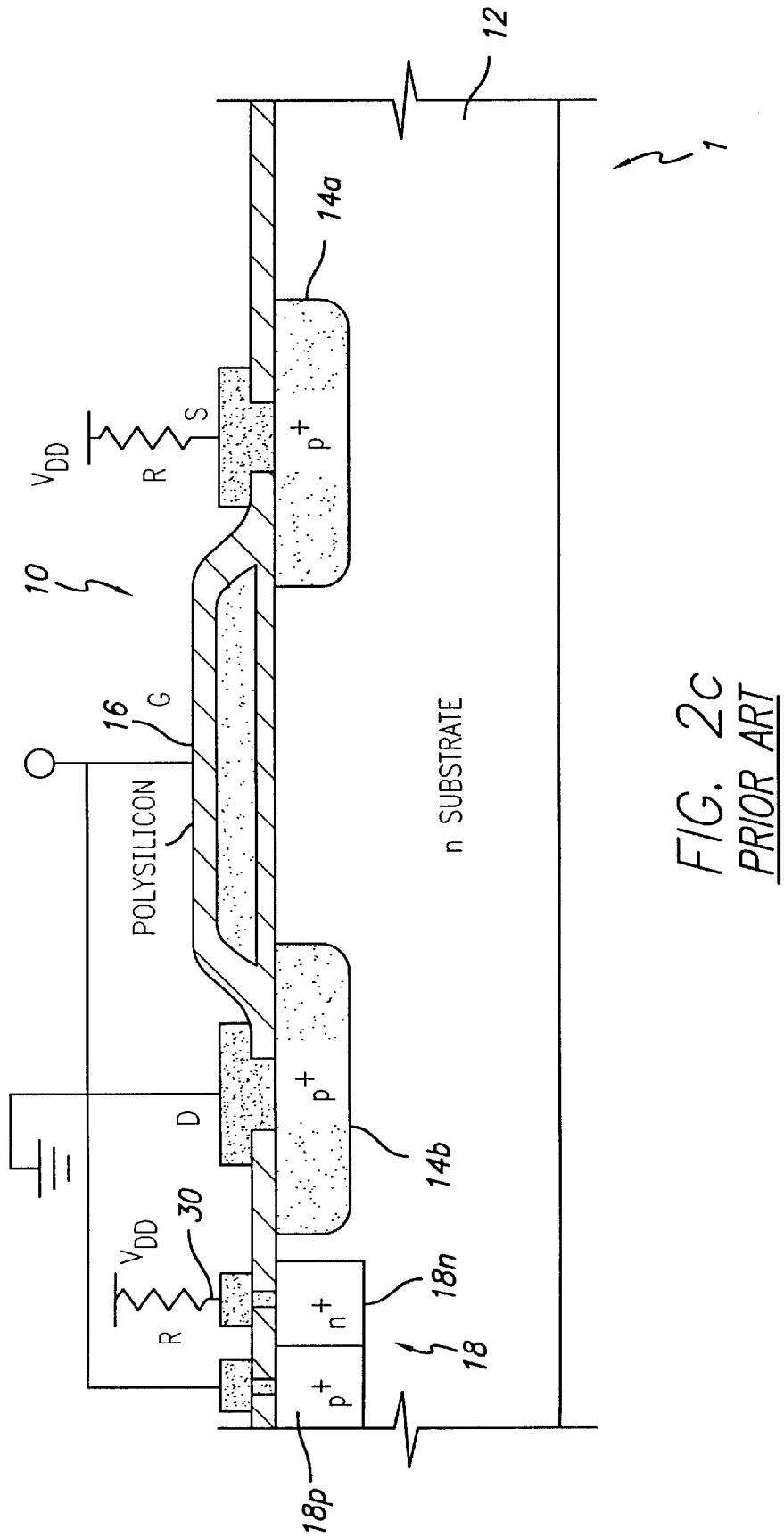
FIGS. 2c and 2d, each illustrates a cross section of a IC with a diode connected at the gate input of the MOS transistor.
Figure 2D:
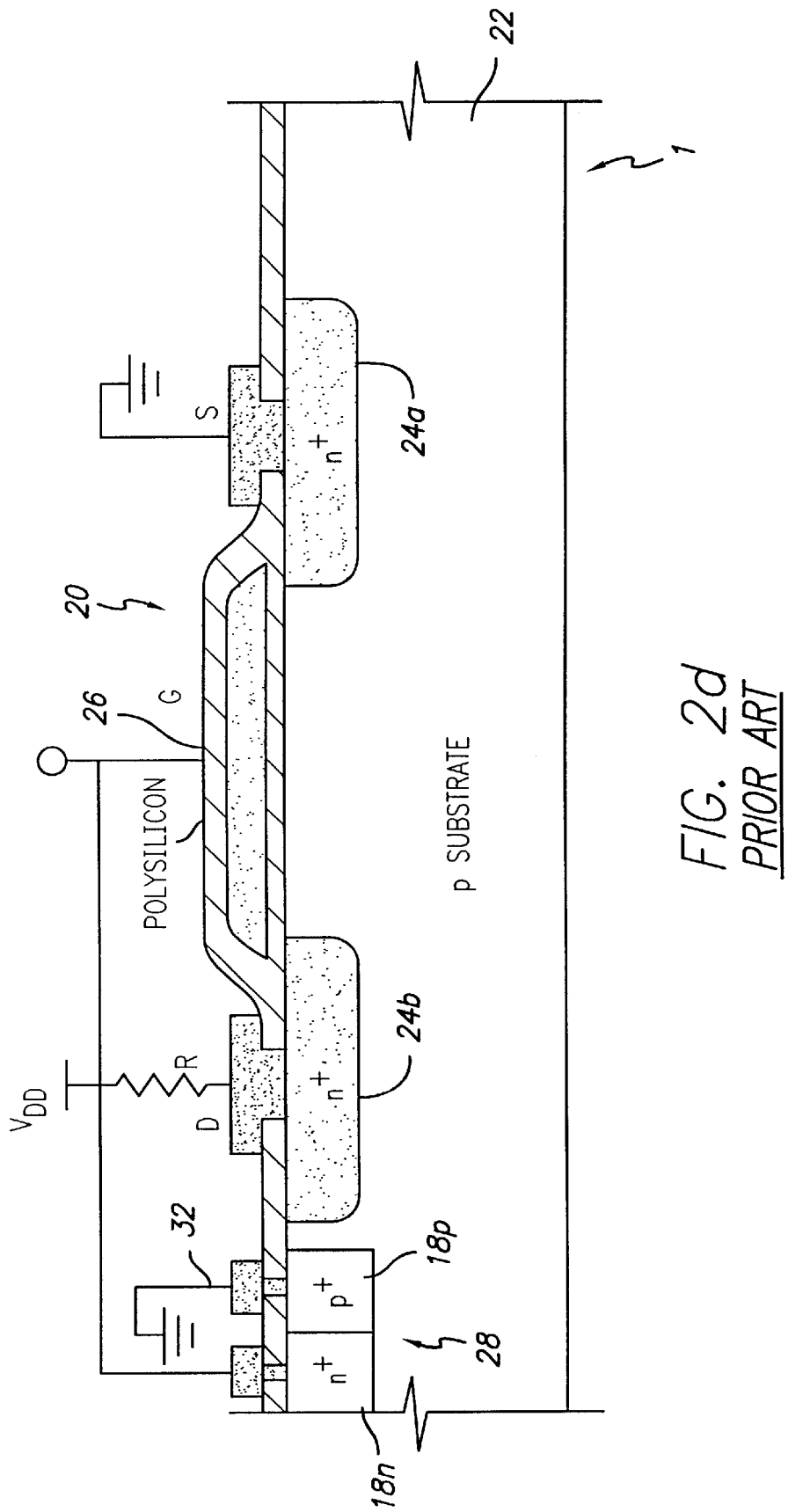
Figure 3A:
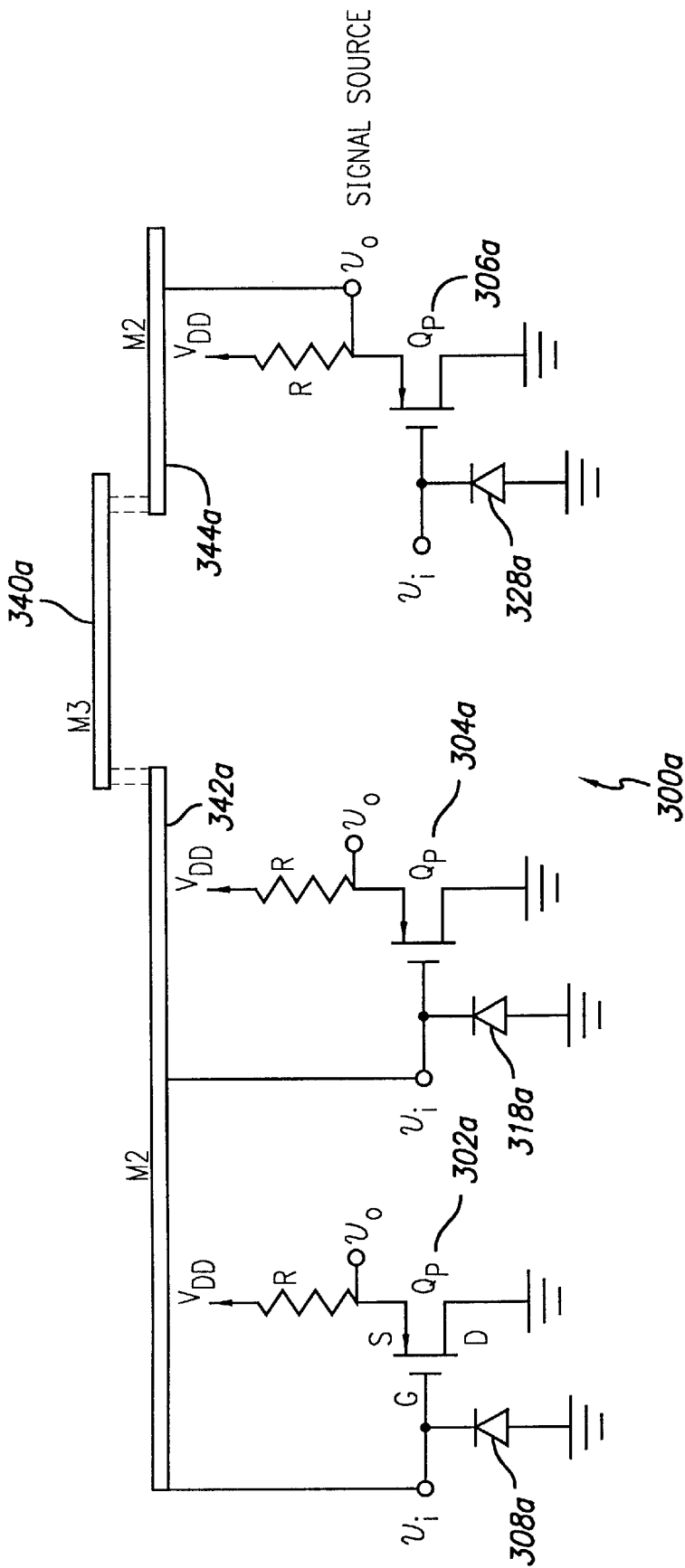
FIGS. 3a–c each illustrates an IC with a diode connected at the gate input of each MOS transistor.
Figure 3B:
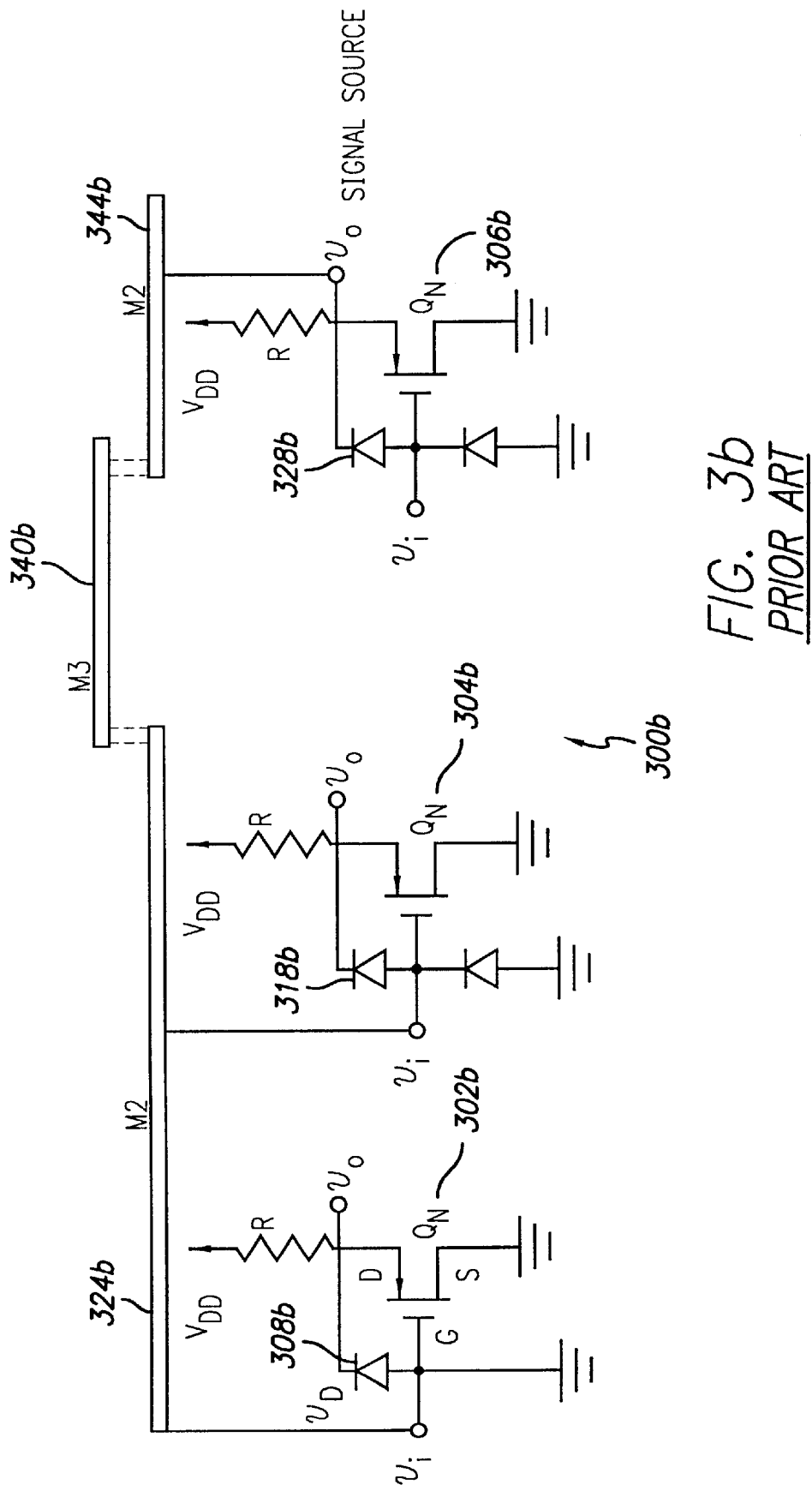
Figure 3C:
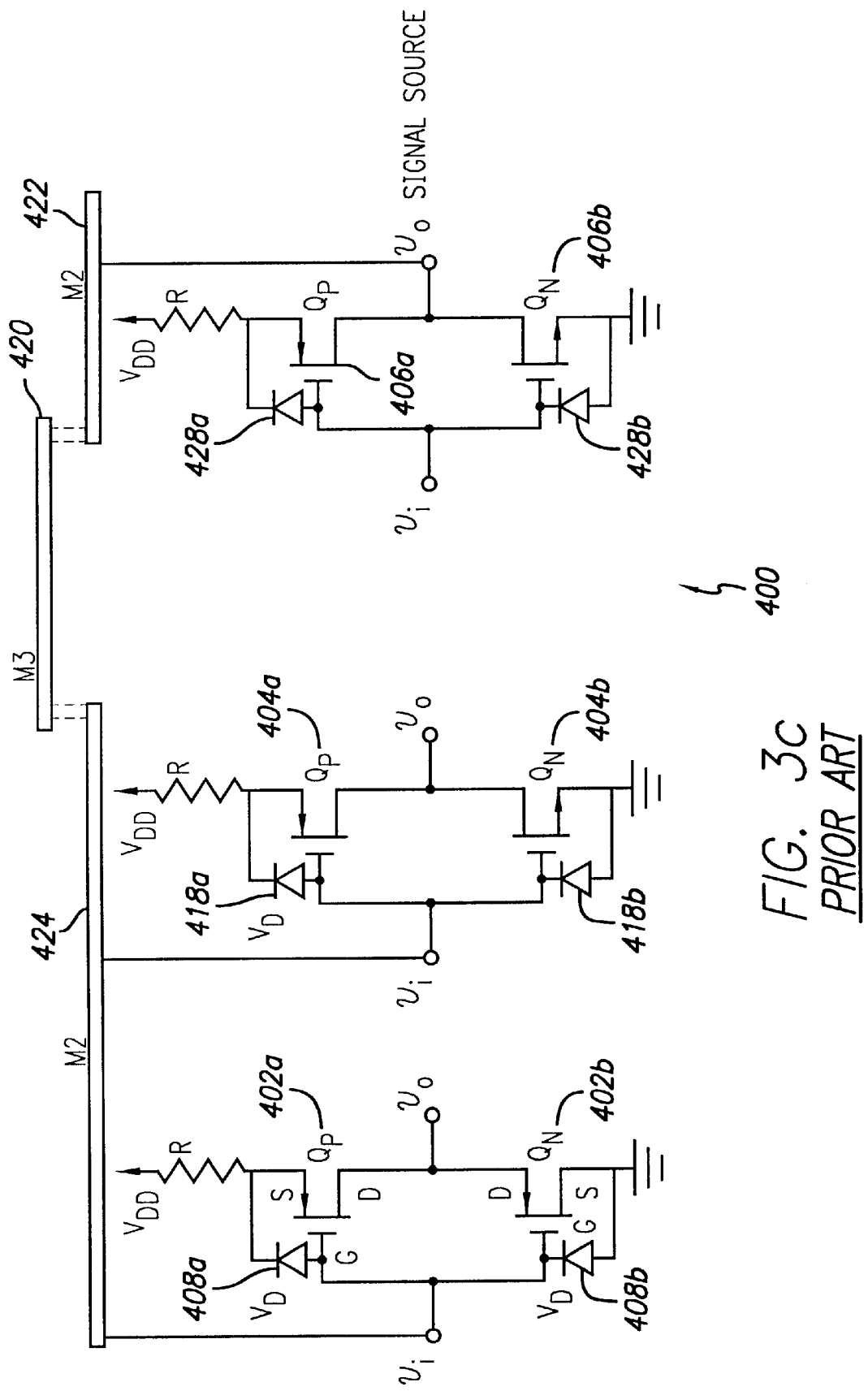
Figure 4A:
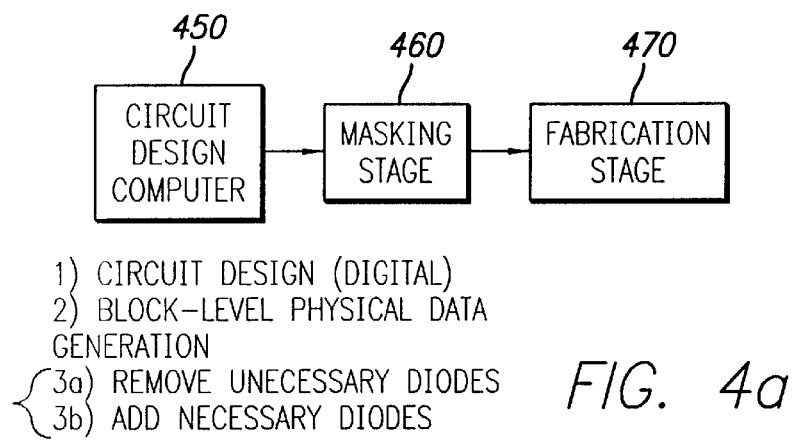
FIG. 4a illustrates the processes involved in producing ICs.

In general, the processes involved in producing ICs are illustrated in FIG. 4a. As shown, the first process is circuit design 450. In accordance with a purpose of the invention, the circuit design 450 includes specification, design and synthesis of the electronic circuit to be embodied in the IC. This can be performed manually or by using a design automation tool. Once the electronic circuit is well defined, block-level physical data generation takes place. In design automation, this includes computerized selection of cells from a cell library, assembling selected cells structure information, placing the cells and routing.

Routing produces a pattern of interconnections between the cells. The pattern of interconnections is specified to implement the function of the electronic circuit. Metallization invariably makes use of this pattern in producing a metal layer for carrying signals to and from cells. After the placement and routing, the number of antenna diodes is suitably reduced, either by removing unnecessary diodes or by adding a suitably minimal number of diodes.

A second process in producing ICs is the masking stage 460. Masks are used for controlled alteration of the electrical properties of a silicon substrate (wafer) and the type of carriers used to produce electrical conduction. The masks are patterned layers of photosensitive material. The patterns define the surface geometry of the various IC components in accordance with the electrical circuit design and cells placement. In defining this geometry, and controllably altering the electrical properties and type of carriers, masks control processes such as diffusion, ion implantation, chemical vapor deposition (CVD) oxidation, etching, etc.

A third process is the fabrication stage 470. During this stage, the masks are used for producing, each layer at time, the controlled alterations of electrical properties and type of carriers.

Figure 4B:
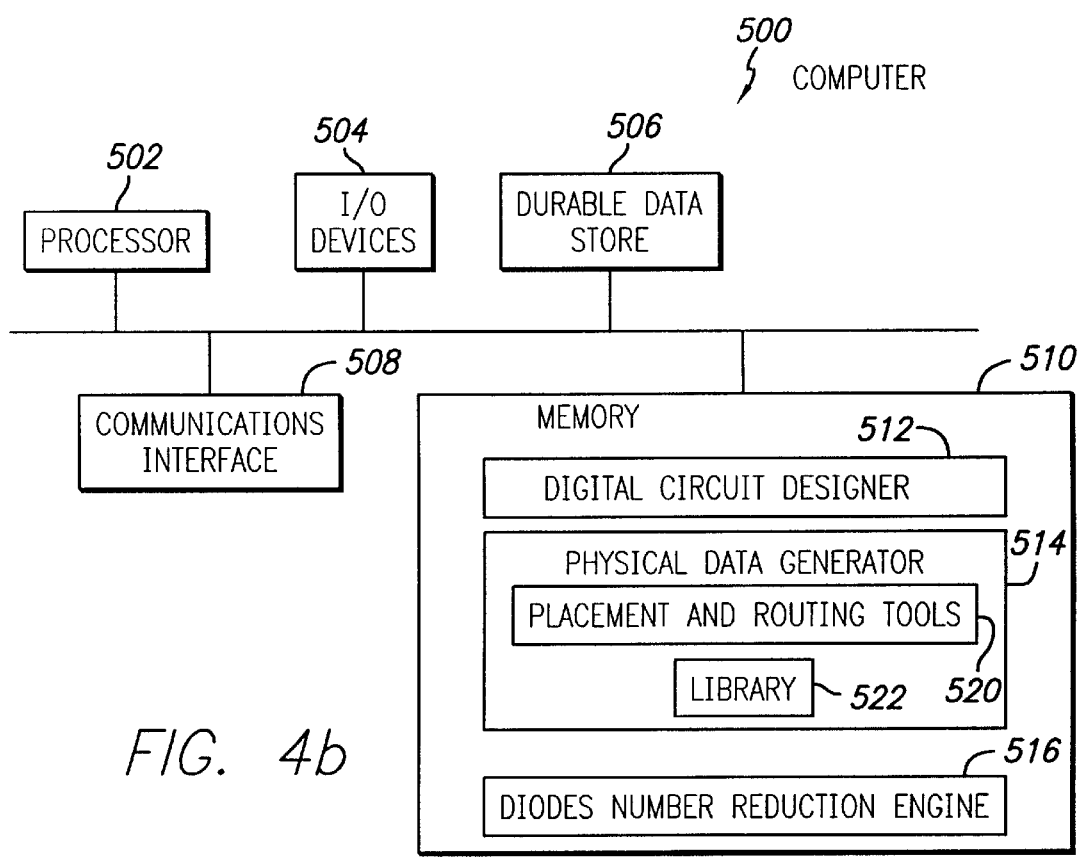
FIG. 4b illustrates a computer system in which an embodiment of the invention can be implemented.

In accordance with a purpose of the invention, a computer system can be used in which an embodiment of the invention is implemented. Namely, the circuit design and mask patterns preparation stages 450 and 460 can be performed in a computer system. The invention can be implemented in the computer system as a separate design automation tool or as part of other design automation tools. FIG. 4b illustrates a computer system 500 in which an embodiment of the invention can be implemented.

The computer system 500 is shown as a representative environment for the invention. Structurally, the computer system 500 includes a processor 502, input/output (I/O) devices 504, a communication interface 508, a durable data storage device 506 and memory 510. Computer system 500 represents a wide range of commercially available or proprietary types of computer systems. The structure of computer 500 is not limited to the illustrated configuration and may include different or additional components. For example, computer 500 may have more than one processor for performing various system tasks.

As is further illustrated, the invention can be embodied in the computer system 500 in the form of computer program code stored in a computer readable medium (e.g., 506 and/or 510). Moreover, the library of cells (gate library) 522 may be stored in a computer readable medium (e.g., 506 and/or 510). The computer readable medium may include one or a combination of internal, external, durable, dynamic, fixed and removable computer memory devices.

The illustrated computer readable medium includes memory 510. The memory 510 includes a digital circuit design engine 512, a physical data generator 514 and a diodes number reduction engine 516. The physical data generator 514, includes placement and routing tools 520 as well as the cell library 522.

Figure 4C:
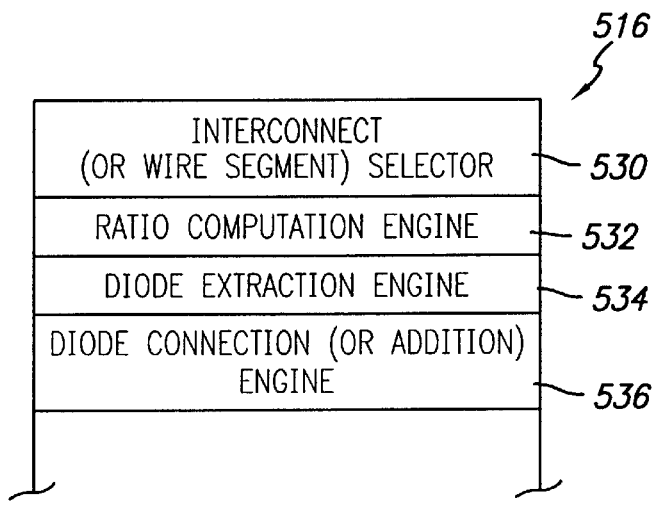
FIG. 4c illustrates a diodes number reduction engine in accordance with an embodiment of the invention.

FIG. 4c illustrates a diodes number reduction engine 516 in accordance with an embodiment of the invention. As shown, the diodes number minimizing engine 516 includes an interconnect selector 530. Typically, an interconnect may have portions (wire segments) thereof placed in more than one metal layer (e.g., $M_2$, $M_3$). While the metal layers are not yet interconnected, all or parts of the interconnect are open and not yet connected to a signal source. The signal source can be external to or internal in the IC. An internal signal source can be, for example, an output of a gate. Accordingly, the interconnects selector focuses on interconnects at and below a particular metal layer (e.g., $M_2$, $M_3$) that are attached to gate inputs but are not fully connected to a signal source. (see, e.g., FIGS. 2a, 2b and 3a–c.

The diodes number reduction engine 516 further includes a ratio computation engine 532 that later will be further described. Furthermore, for removing or adding antenna diodes the diodes number reduction engine 516 includes diode extraction and connection (or addition) engines 534 and 536 that later will also be described.

As mentioned before with respect to FIGS. 2a–d and 3a (see also FIGS. 5a–c), the purpose of metallization is to interconnect the various components, e.g., MOS transistors, of the IC to form the desired electronic circuit. As further mentioned, metallization involves the deposition of a metal layer ($M_2$, $M_3$) 340 and 342 or 420 and 422 over the surface followed by etching interconnects in a pattern that implements the electronic circuit function. Hence, after routing, in preparation for metallization, the IC includes one or more patterns with a plurality of MOS transistors interconnected via at least one metal layer (e.g., $M_2$ and $M_3$ 340 and 342 or 420 and 422).

It may be recalled that the term MOS transistors is inclusive of NMOS (n-type MOS), PMOS (P-type MOS), MOSFET (MOS field effect transistor), CMOS (complimentary MOS), etc. Moreover, it is noted that the term metal layer is used in a general sense that includes any suitable conductive material, particularly metals.

During etching of the metal layers, static charges are induced. In order to prevent the accumulation of charge due to the antenna behavior of open interconnects, gate protection is provided by way of antenna diodes. However, a diode at a gate input introduces an added capacitance at the gate input. The capacitance of the diode combines with the gate capacitance to produce an increased load capacitance and, in turn, a slower response time.

Antenna Diodes Reduction

Figure 5A:
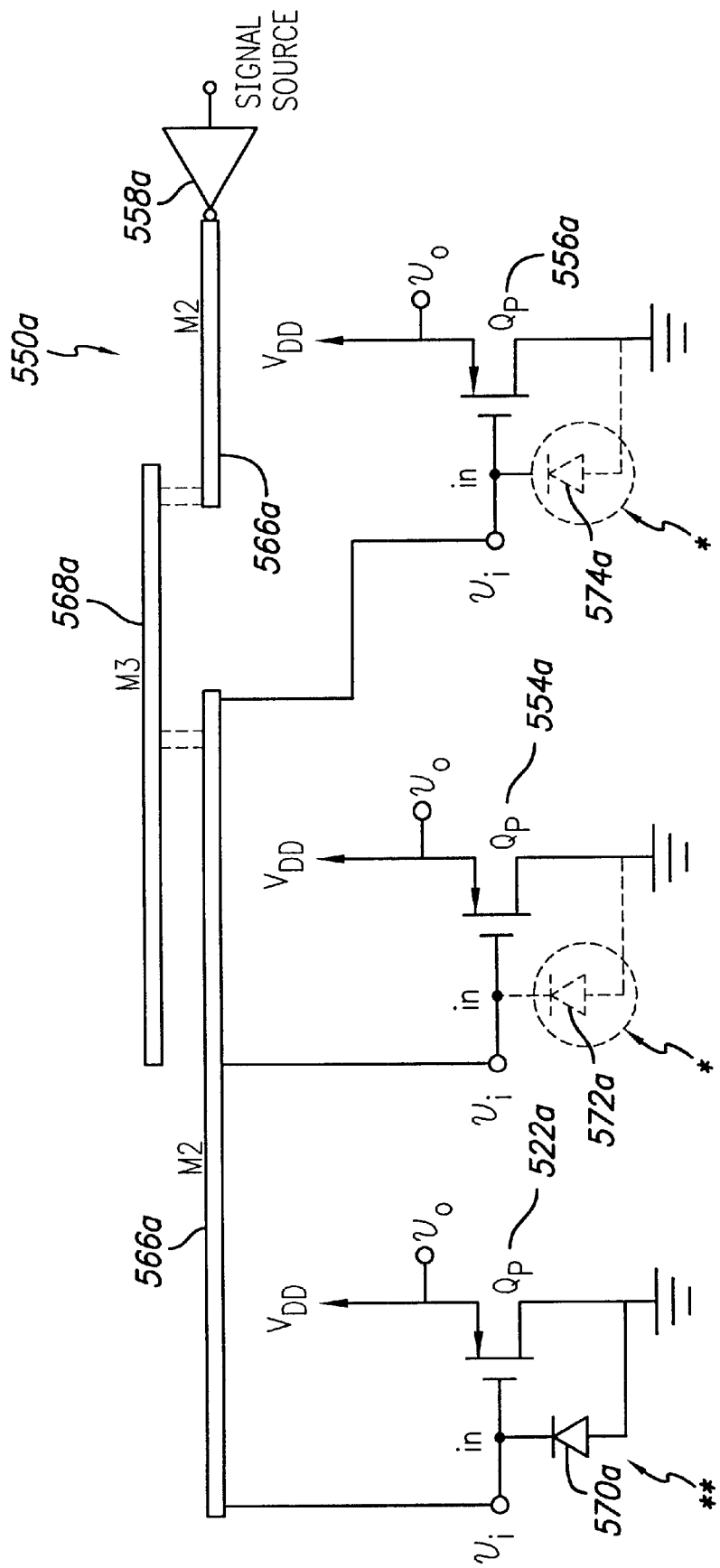
FIGS. 5a–c illustrate an IC with suitably reduced number of diodes for gate input protection.
Figure 5B:
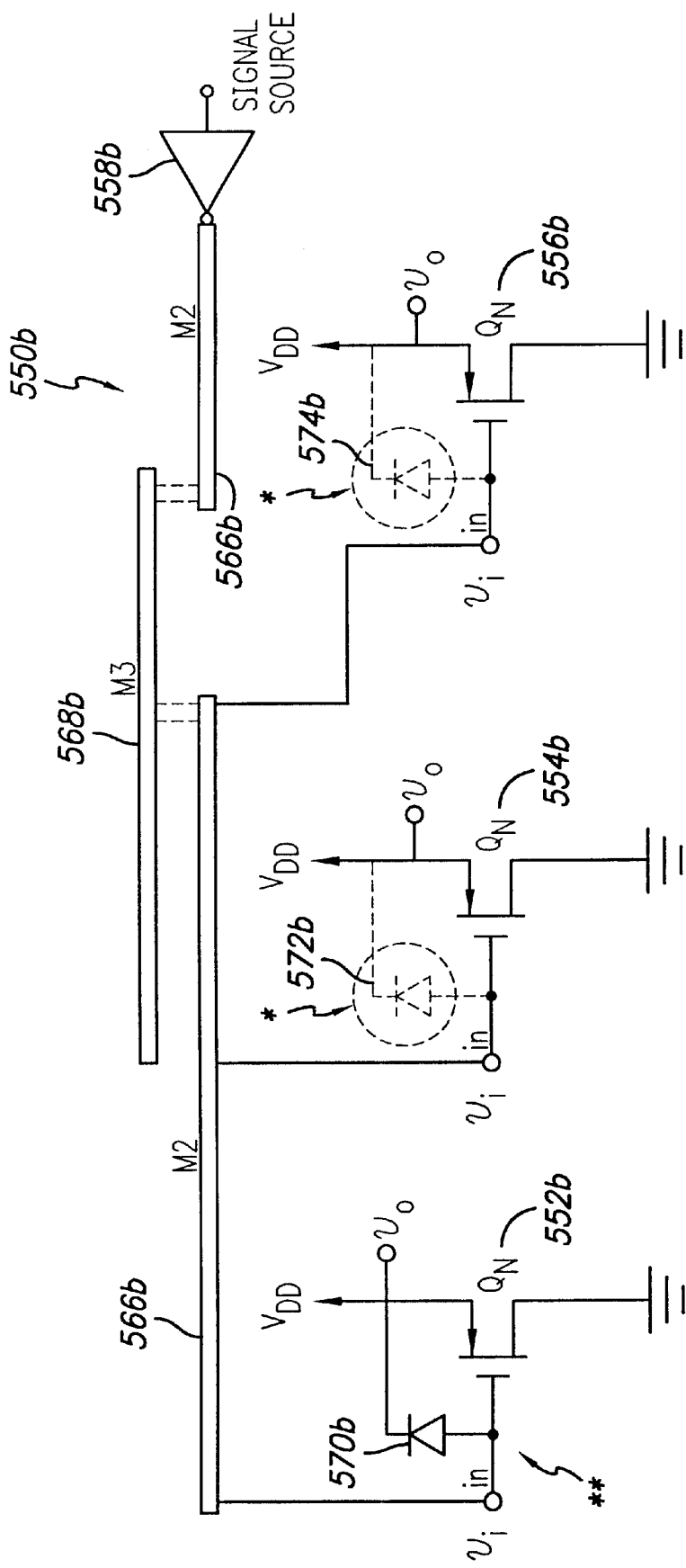
Figure 5C:
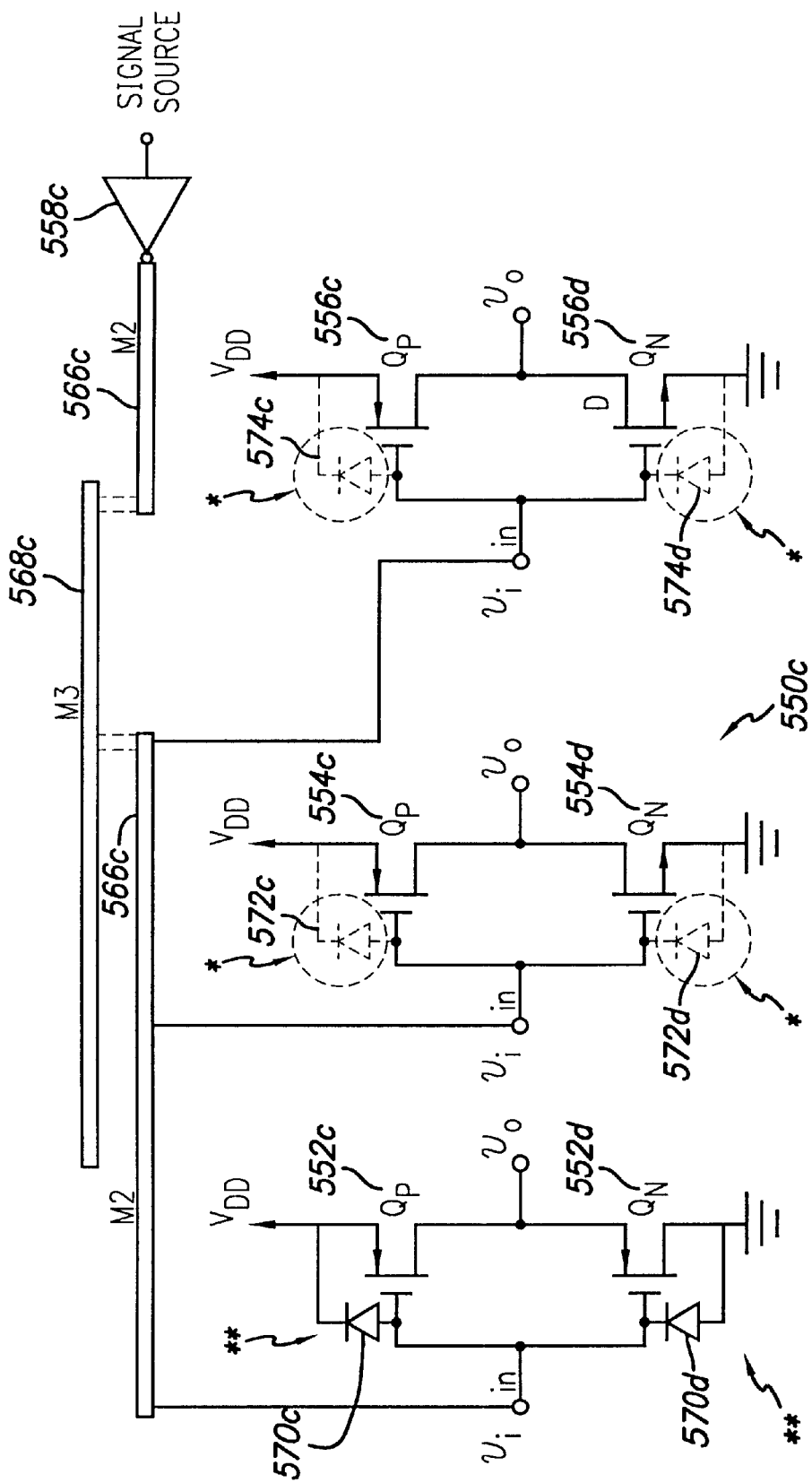

FIGS. 5a–c illustrate an IC with suitably reduced number of diodes for gate input protection. Each of the illustrated MOS transistors 552a–d, 554a–d and 556a–d (hereafter 552, 554 and 556), are initially provided with an antenna diode for gate input protection. Based on certain criteria as will be later explained, all but a selected antenna diode 570a–d are removed. Alternatively, each of the illustrated MOS transistors 552, 554 and 556, are initially provided without an antenna diode for gate input protection. Based on certain criteria as will be later explained, only a selected gate input receives an antenna diode 570. Accordingly, the protection mechanism includes a suitably reduced number of antenna diodes which is sufficient to provide the gate inputs protection.

The criteria involved in reducing the number of antenna diodes relates to the physical characteristics of the gates and interconnects. It may be recalled that gate inputs that are attached to segments of interconnects which are not yet connected to a signal source, remain open circuited. Due to the antenna-like behavior of open interconnects, such gate inputs are subject to accumulation of charges. Therefore, essentially, segments of interconnects routed at a metal layer and metal layers below it (e.g., $M_2$ 566, $M_3$ 568) in the IC structure are checked to find out if there are any segments of interconnects to gate inputs that are not yet connected to a signal source (such as an external source or another cell; see inverter cells 558a–c in FIGS. 5a–c).

Each signal route has one or more interconnects that are handled individually, and each interconnect is handled individually. In turn, each segment within each interconnect (within each signal route) is handled individually.

Further, a ratio is established for each segment of an interconnect to a gate input that is not yet connected to a signal source. The ratio relates to the physical characteristics of the gate and interconnect and is expressed as the relationship between the gate area and area of the interconnect. The ratio is then compared against a set criteria such as an upper limit. Finally, based on this comparison and the number of gate inputs attached to the interconnect a decision is made whether to reduce to a minimum the number of antenna diodes. Once a decision is made, the number of antenna diodes is adjusted accordingly, as will be further explained below.

Figure 6A:
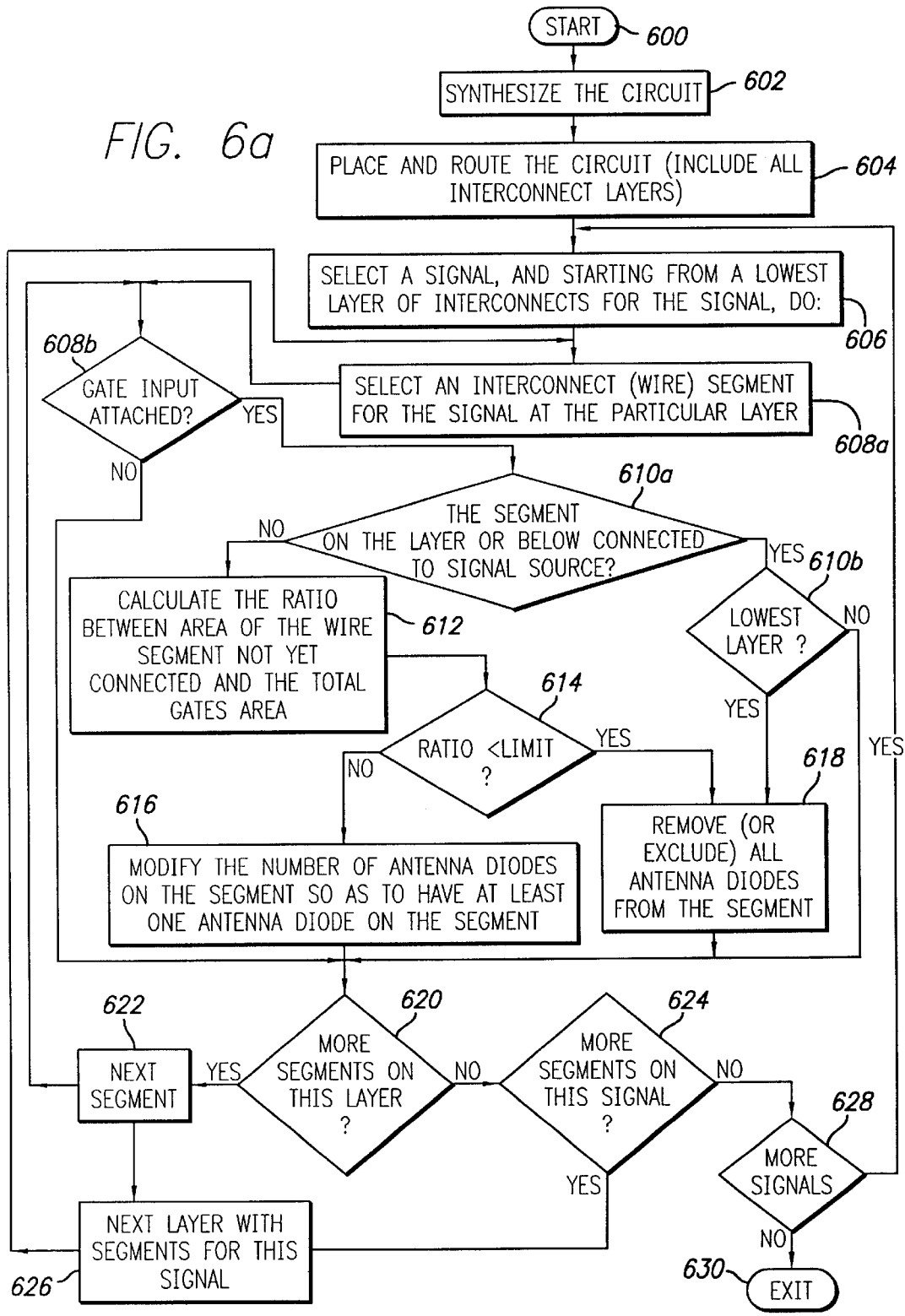
FIG. 6a is a flow diagram of IC design phases including reducing the number of antenna diodes in accordance with an embodiment of the invention.
Figure 6B:
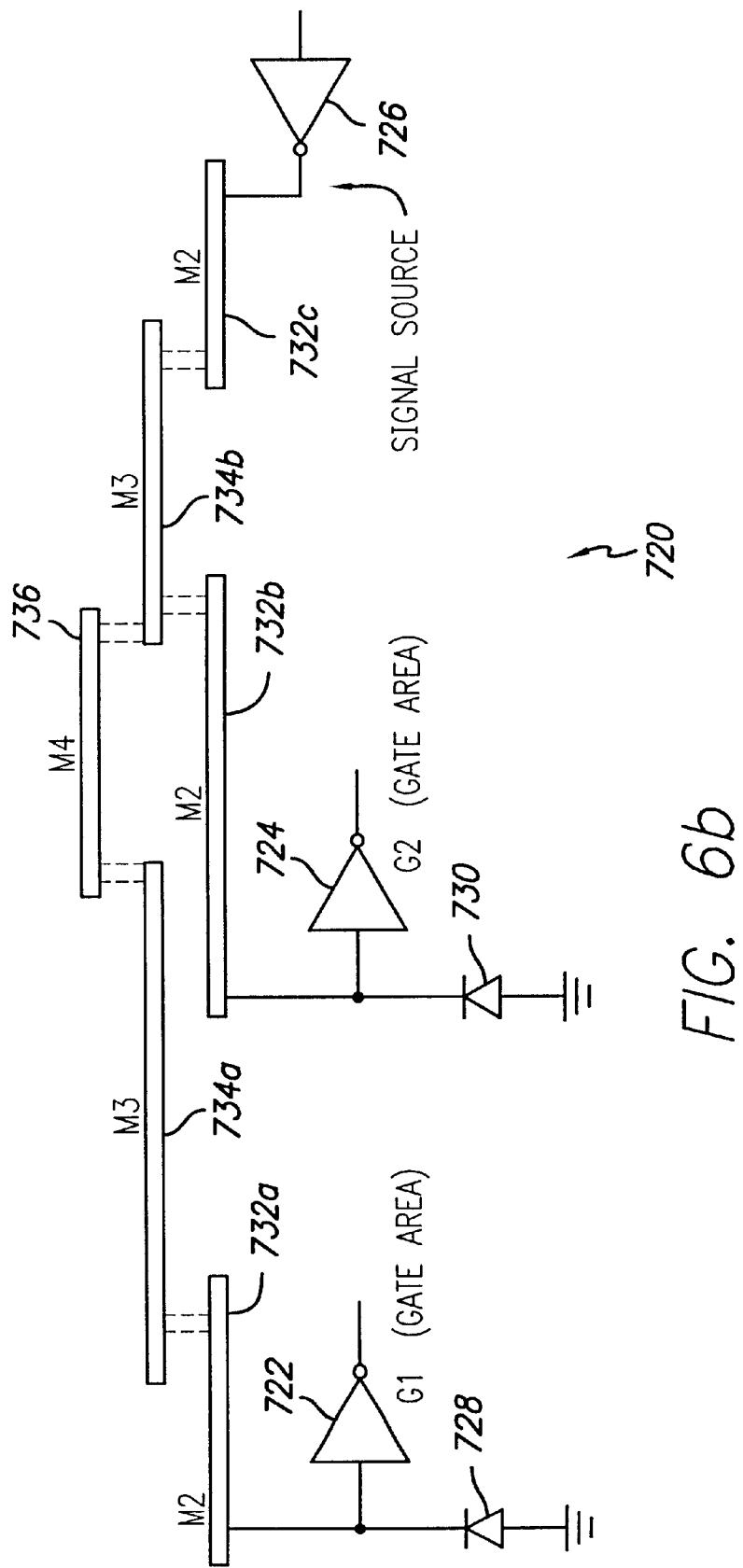

To further illustrate the above, FIG. 6a is a flow diagram of IC design phases including reducing the number of antenna diodes in accordance with an embodiment of the invention. FIG. 6b is diagram of an IC being produced in accordance with the flow diagram of FIG. 6a. FIG. 6b is referred to during the following discussion of FIG. 6a in order to further explain the steps in the flow diagram.

As shown, the IC design phase of FIG. 6a begins with step 600. As previously mentioned, once an electronic circuit is designed it is synthesized, via step 602. Then, placement of and routing between components (cells) of the electronic circuit are performed, via step 604. After the routing, one at a time, segments of interconnects to gate inputs that are not yet connected to a signal source are singled out for further treatment (step 608a), as will be further explained below. This is done for each signal route (step 606) and for each interconnect in the signal route (steps 608a, 620 and 622).

Namely, one at a time, the signal routes are selected to be examined (step 606). Each of the signal routes may include multi-layered interconnects, i.e., interconnects that have segments on more than one metal layer. Hence, the examination of interconnect segments in each of the signal routes starts at the respective lowest metal layer and proceeds to end at the respective top metal layer. As mentioned, each segment is treated individually. To that end, an interconnect segment, or simply segment (also known as wire) at the particular metal layer is selected via step 608a.

With reference to each selected segment, it is determined, via step 608b, if the selected segment (e.g., 732a) is attached to any gate inputs (e.g., G$_1$ 722). If so, it is also determined if the segment, in the current metal layer or below, is connected to a signal source (step 610). However, if the segment is not attached to any gate, a next segment is selected, via step 622.

Figure 7:
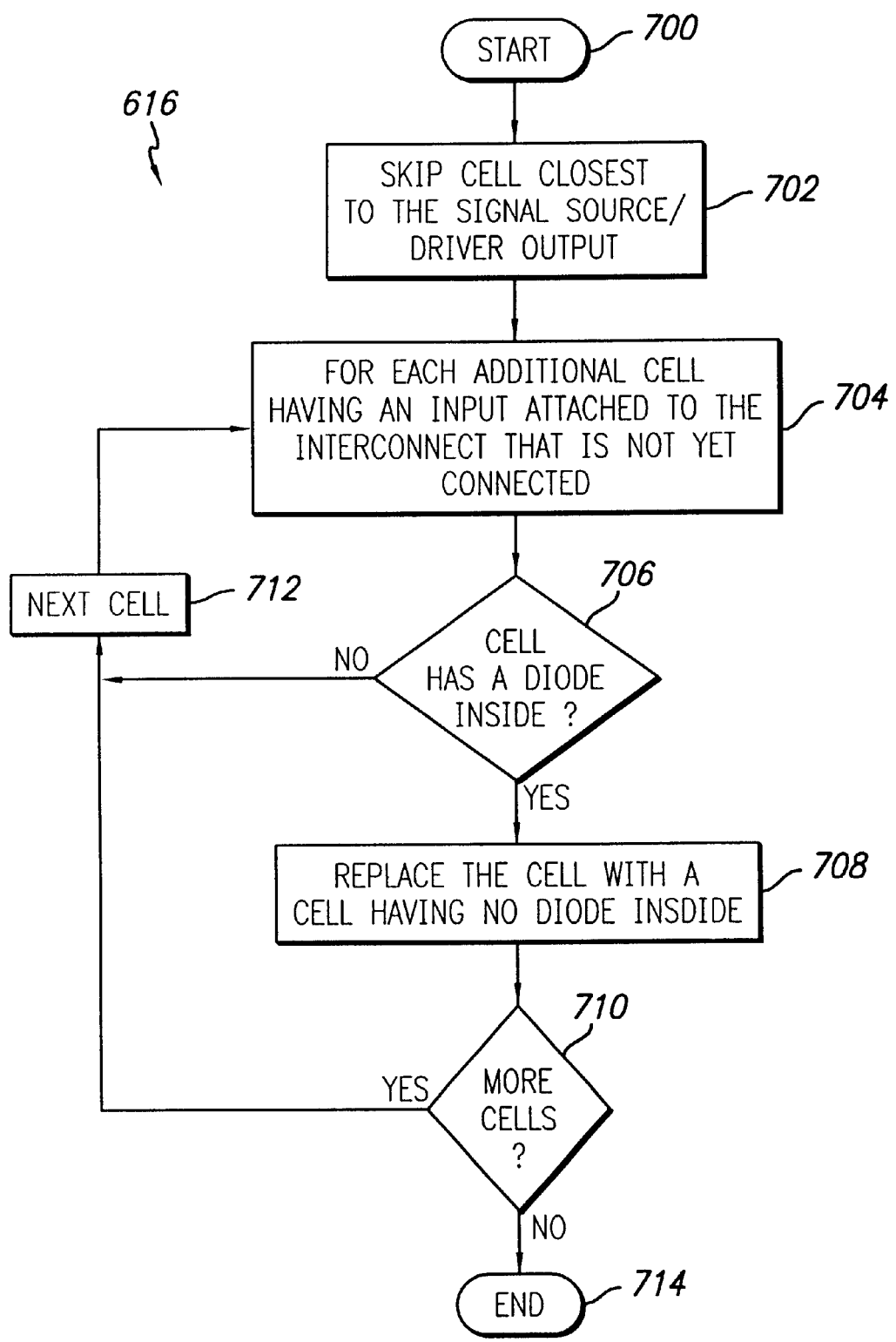
FIG. 7 is a flow diagram of one approach to removing antenna diodes so as to minimize their number in the electronic circuit.

If (as shown in FIG. 7) the selected segment is connected to a gate input but this segment and any segment(s) at the current metal layer or below is(/are) not yet connected to the signal source (step 610), a ratio between total gate(s) and segment area(s) is next determined, via step 612. This ratio, R, is expressed as follows:

$$R = \frac{area_{metal}}{area_{gate}}$$

where, $area_{metal}$ is the total area of the interconnect in the current signal route including parts (segments) not yet fully connected, and $area_{gate}$ is the total gate(s) area (of all transistors connected to the segment under consideration.

Assuming, for example, that the first segment selected is 732a at M2 (FIG. 6b). This segment is connected to gate 722 (G$_1$). For the purpose of this discussion, a "gate" is a short way of saying a MOS transistor at the input of a gate. For this example, the total metal area equals the metal areas of segments at metal areas M2 and M3 that are not yet connected to the signal source 726. This means that even if segment 732a is small by comparison to the gate area of G$_1$, taking into consideration also the areas of segments at M3 increases the total metal area relative to the gate area and, in turn, increases the ratio, R. As a further example, segment 732b at M2, which is attached to G$_2$, is of a large area and even by itself produces a high ration result.

It is noted that in the alternative case where the segment that is attached to the gate is attached to a signal source (connection scenario is not shown), this segment does not behave as an antenna with respect to the corresponding gate input(s) and the gate(s) (G$_1$ and G$_2$) 722 and 724 are not be open circuited. For this reason, if the segment under consideration (e.g. M2, 732) is at the lowest metal layer for this interconnect and if the segment is connected to the signal source, gate input(s) protection is not needed. When gate input protection is not needed, antenna diodes need not be included at the gate input(s). Therefore, in step 610b it is determined whether the selected segment is at the lowest metal layer for the routed interconnect (e.g., M2) and, if so, in step 618 implementation of the electronic circuit is modified to remove, or exclude, all antenna diodes from the corresponding gate inputs (e.g., 722 and 724). That is, the number of antenna diodes at each of these gate inputs attached to the segment at the lowest metal layer is reduced to zero.

When the segment is not connected to a signal source, in this embodiment the calculated ratio, R, is then compared to a predetermined upper limit (UL), e.g. 50, via step 612, as follows:

is R≧UL ?, e.g., is R≧50 ?

This predetermined upper limit can be a number lower than 50.

If the ratio, R, is at or exceeds the upper limit, then at least one antenna diode (e.g. 728) is needed at the designated gate input(s) for protection against breakdown (step 616). If there is only one gate input attached to the interconnect, then the antenna diode is maintained at this gate input. If there are two or more gate inputs attached to the interconnect, then at least one antenna diode is maintained and the others are removed. In other words, via step 616, the implementation of the electronic circuit is modified to remove, or exclude, antenna diodes from the corresponding gate inputs so that at least one antenna diode is maintained with, or added to, at least one designated gate input. If one antenna diode is sufficient to provide the needed gate input protection, only one antenna diode will be maintained, or added. This approach provides sufficient gate input protection and, at the same time, improves the speed and power consumption of the electronic circuit in the IC.

In accordance with an embodiment of the invention, an antenna diode is maintained with, or added to, the gate input of a MOS transistor that, among the MOS transistors associated with the segment, is closest to the signal source (e.g., as shown in FIGS. 5a–c). More remote diodes are removed. This approach provides an additional improvement of the IC speed. The removal, or addition, of diodes can be done in a number of ways as will be later described.

Conversely, gate input(s) protection is not needed if the ratio is below the predetermined upper limit. Hence, when gate input protection is not needed antenna diodes need not be included at the gate input(s). As before, step 614 includes modifying the implementation of the electronic circuit to remove, or exclude, all antenna diodes from the corresponding gate inputs.

It is noted, however, that in further examination of the signal route in the exemplary IC of FIG. 7, additional segments 734 at the next metal layer M3 will be visited. As shown, these segments are not connected to a signal source (steps 624, 626, 608*b* and 610*a*), and no gate is attached to them (step 608*b*).

Before the next metal layer (M3) is reached, step 620 is performed to determine if, for this signal route, there are additional segments on the current metal layer (M2). If for the signal route, as shown for example in FIG. 7, additional segments (e.g., 732*b*) are present on the same metal layer (M2), the next segment is selected for treatment (step 622). As with respect to the preceding segment, it is determined whether any gates are attached to the next segment (step 608*b*) and whether the next segment is connected at or below the metal layer to a signal source (step 610*a*). If this segment is attached to a gate but it is not connected to a signal source, the segment-gate ($G_2$) areas ratio (R) is calculated, via step 612. The metal area includes the areas of segments at metal layers M2 and M3 that are not connected to the signal source (e.g., 732*b* and 734*b* areas). If the ratio is not lower than the predetermined upper limit (step 614), the number of antenna diodes is modified (step 616) so as to maintain or add at least one antenna diode for gate input protection of $G_2$ 724.

At this point, assuming that there are no more segments at the current layer (step 620), it is determined, via step 624, whether there are more segments for the signal route. As noted before, a signal may be carried by interconnect segments at more than one metal layer. Hence, there is a need to check, one at a time, other metal layers at higher levels (e.g., M3 and M4). Assuming that in the exemplary IC metal layer M3 has already been traversed (as explained above), the next layer to be selected is M4 (step 626). As shown, segment 736 at M4, segment 734*a* at M3 and segment 732*a* at M2, are not connected to the signal source 726 (step 610). Moreover, segment 736 at M4 and segment 734*a* at M3 are not attached to any gate. Therefore, the process skips over steps 610*a*, 612, 614 and 616.

If at step 620 it is determined that there are no more segments at this layer and if there are no more segments associated with the signal route (step 624), it is determined if more signal routes remain to be examined (step 628). If no more signal routes remain to be examined, this phase of IC production ends (exit step 630). If more signal routes remain to be examined, a signal route among them is selected via step 606. The process described above with respect to the previous signal route is repeated for this and any addition signal route, starting with step 606. This process continues until the entire electronic circuit has been traversed (and no more signal routes and interconnect segments associated with them remain untouched). The process ends via step 630.

As mentioned before, when required for gate input protection at least one antenna diode is either maintained or added. FIG. 7 is a flow diagram of one approach to removing antenna diodes so as to minimize their number in the electronic circuit.

It may be recalled that the electronic circuit is embodied in the IC. Assuming that cells including a gate input protection, i.e., antenna diode, have been selected from the cell library to form the corresponding MOS transistors (or other MOS devices) in the electronic circuit. In accordance with an embodiment of the invention, the cell forming a MOS transistor closest to the signal source (or signal driver output) is skipped (step 702). Using the antenna diode in the MOS transistor closest to the source conditions (restricts) the voltage at the interconnect for all the gate inputs that are attached down the line.

Accordingly, for each additional cell having a gate input attached to the interconnect, it is determined if the cell has a an antenna diode (steps 704 and 706). Assuming that all cells have been selected with an antenna diode, this determination will produce a positive answer. Else, if the foregoing assumption does not apply, then this determination will produce a negative answer, and the next cell is examined, Via step 712.

Cells, other than the one skipped, that have antenna diodes inside are then replaced with cells that do not have antenna diodes inside, via step 708. In the case of automated IC design using a computer system, the data of cells with antenna diodes is replaced with data of cells without antenna diodes. If more that one gate input is attached to the interconnect, the process of replacing cells repeats (via steps 710 and 712) until all cells have been treated.

Figure 8:
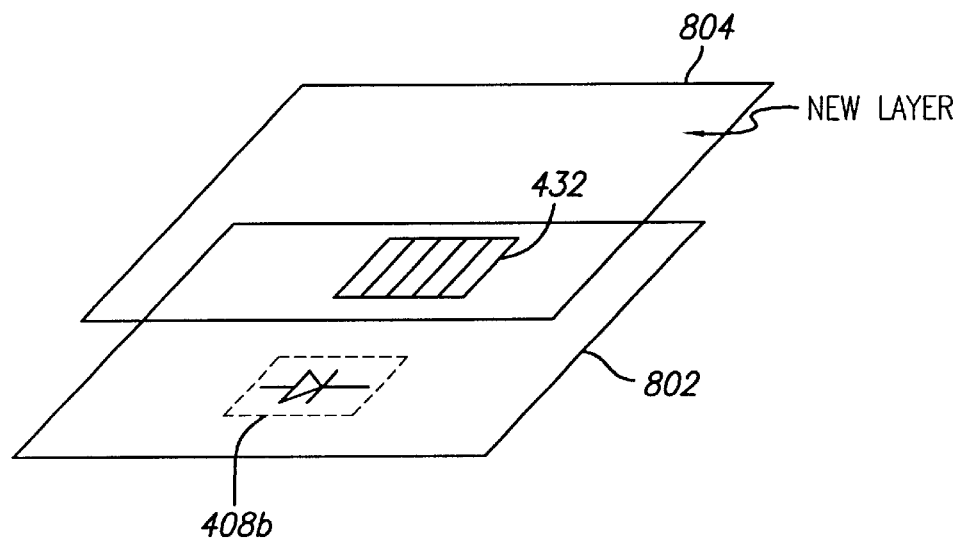
FIG. 8 illustrates an alternative approach to removing antenna diodes so as to minimize their number in the electronic circuit.
Figure 8:
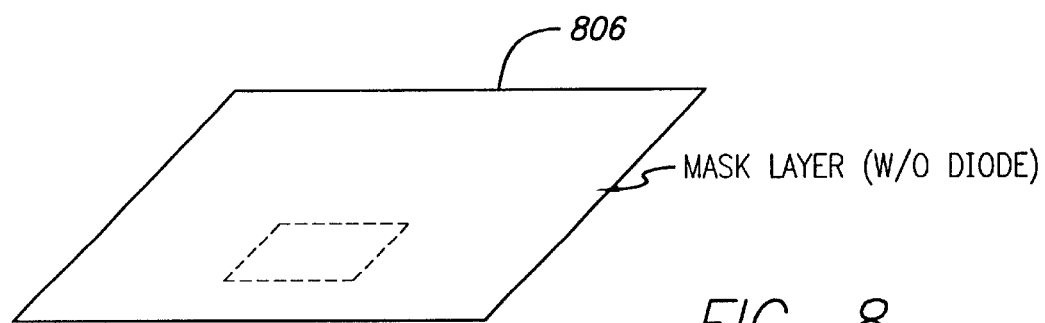

FIG. 8 illustrates an alternative approach to removing antenna diodes so as to minimize their number in the electronic circuit. This approach involves using a new layer 804 defined so that designated areas in the mask pattern (represented by mask data) do not have antenna diodes. The new layer is superimposed on a layer below 802 of the cells that were originally selected with antenna diodes, e.g., 408. The areas in the new layer 804 are designed so that each of the areas covers one of the antenna diodes that is designated for removal. The end result is a mask layer 806 without the (removed) antenna diodes. Extracting the antenna diodes from the mask layer can be accomplished by alternative means, including removing the data of such diodes from the mask data.

Figure 9:
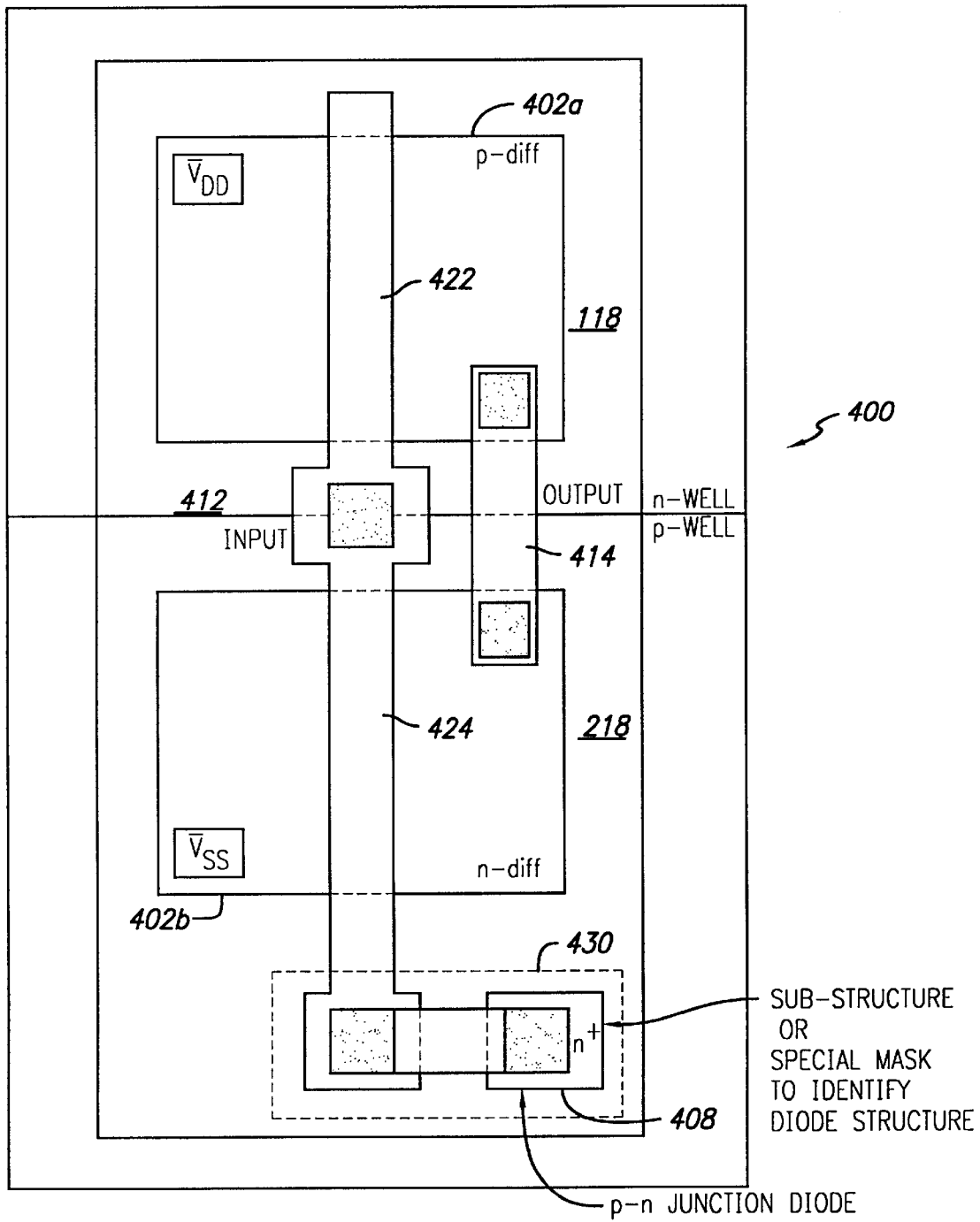
FIG. 9 illustrates yet another approach to removing antenna diodes so as to minimize their number in the electronic circuit.

FIG. 9 illustrates yet another approach to removing antenna diodes so as to minimize their number in the electronic circuit. This approach involves using for the IC 400' a mask layer of cells that form MOS transistors or devices 402 with a sublayer 430 of antenna diodes. Alternatively, this approach can involve a mask layer having, initially, a diode substructure 430 for each cell with gate input protection. Removing the diode substructures (or sublayer) flattens the mask layer and eliminates the antenna diodes that are designated for removal. It is noted again that at least one diode remains if gate input protection is required.

Figure 10:
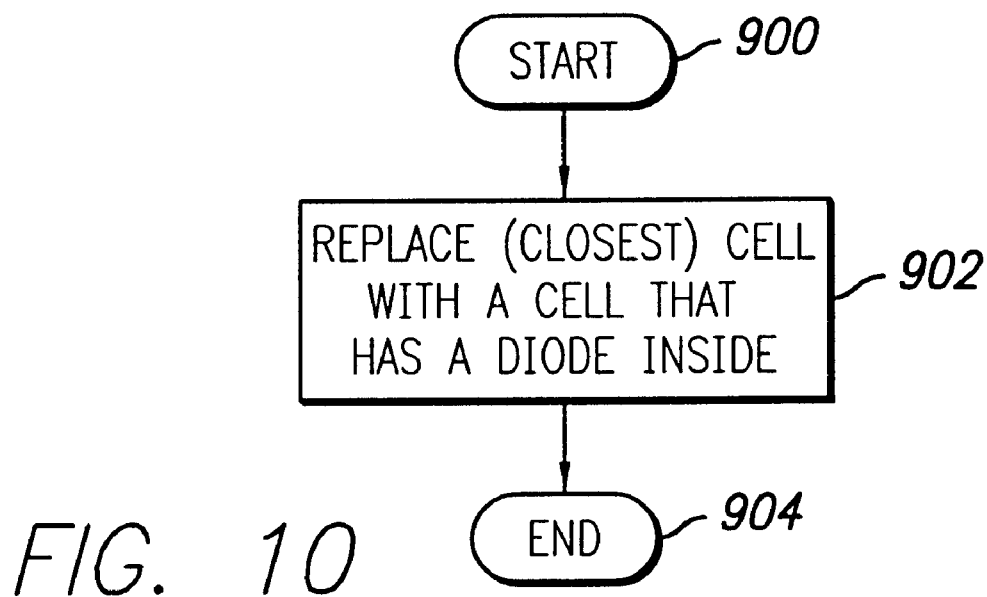
FIGS. 10 and 11 illustrate two alternative approaches to adding an antenna diode.
Figure 11:
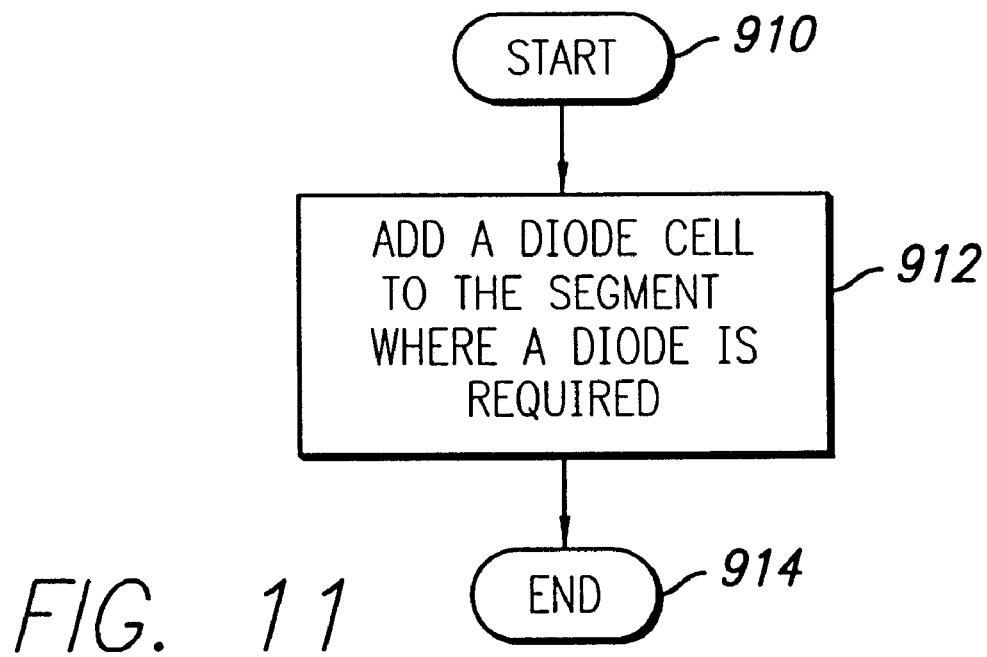

FIGS. 10 and 11 illustrate two alternative approaches to adding an antenna diode. The addition of at least one antenna diode introduces a suitably minimal number of antenna diodes in the electronic circuit. The approach of FIG. 10 involves replacing the cell that forms a MOS transistor (or device) closest to the signal source with a cell that has an antenna diode for gate input protection (step 902). This approach is suitable in cases where cells, originally selected from the cell library, have no antenna diodes.

The approach of FIG. 11 applies also to the case where cells, originally selected from the cell library, have no antenna diodes. This alternative approach to adding an antenna diode involves adding a cell the forms an antenna diode. The antenna diode is added, via a connection, to the interconnect rather than a gate input of a MOS transistor. In an embodiment of the invention, the antenna diode is added to the interconnect closer to the signal source.

In summary, the present invention provides gate input protection with a reduced number of antenna diodes. An IC design that implements the present invention achieves higher performance and reliability. The number of antenna diodes is reduced in order to achieve the higher performance albeit taking gate input protection measures to prevent breakdown. Reducing the number of antenna diodes improves the overall performance of ICs in terms of speed and power consumption.

Other embodiments will be apparent to those skilled in the art from consideration of the specification and practice of the invention disclosed herein. It is intended that the specification and examples be considered as exemplary only, with a true scope of the invention being indicated by the following claims and equivalents.

What is claimed is:

1. A method for minimizing the number of antenna diodes, comprising:

selecting a segment of an interconnect routed in one or more metal layers of an integrated circuit (IC);

determining whether the selected interconnect is attached to any gate input and, if so, further determining whether the selected segment is connected to a signal source;

determining whether the selected segment is at the lowest metal layer for the routed interconnect if the selected segment is already connected to a signal source and, if the selected segment is at the lowest metal layer, excluding all antenna diodes from all gate inputs that are attached to the selected segment, wherein protection of each gate input is maintained; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce to a minimum the number of antenna diodes; and minimizing the number of antenna diodes if it is so determined, wherein protection of each gate input is maintained.

2. A method as in claim 1 being performed when, of the gate inputs that are attached to the selected segment, at least one gate input is initially configured with an associated antenna diode, wherein the number of antenna diodes is minimized by removing antenna diodes.

3. A method as in claim 1 being performed when the gate inputs that are attached to the selected segment are initially configured without an associated antenna diode, wherein an antenna diode can be added to each corresponding gate input configuration, and wherein the number of antenna diodes is minimized by adding none or a minimal number of antenna diodes.

4. A method as in claim 1, further comprising:

selecting, one at a time until all segments of the interconnect at each of the metal layers for the interconnect have been selected, a next segment in a next higher metal layer, and handling each next selected segment individually;

selecting, one at a time until all interconnects of a signal route have been selected, a next interconnect routed in one or more of the metal layers if no more segments of the interconnect being dealt with remain to be handled, and individually dealing with each next selected interconnect; and selecting, one at a time until all signal routes in the IC have been examined, a next signal route, and examining each signal route individually.

5. A method as in claim 1, wherein the criteria include an upper limit for the ratio and a number of the gate inputs that are attached to the selected segment.

6. A method as in claim 5, wherein the upper limit for the ratio is equal to or lower than 50.

7. A method as in claim 1, wherein the excluding of antenna diodes from gate inputs is accomplished by removing antenna diodes from gate inputs with antenna diodes and by not adding antenna diodes to gate inputs without antenna diodes.

8. A method as in claim 1, wherein the excluding of antenna diodes from gate inputs is accomplished by removing antenna diodes from gate inputs with antenna diodes, and wherein, for each gate input in a cell with an antenna diode designated for removal, the antenna diode is removed by replacing the cell with another cell that does not have the antenna diode.

9. A method as in claim 1, wherein the excluding of antenna diodes from gate inputs is accomplished by removing antenna diodes from gate inputs with antenna diodes, and wherein, for each gate input with an antenna diode designated for removal, the antenna diode is removed by superimposing a new layer over the layer that includes each of the gate inputs and their corresponding antenna diodes, the new layer having areas designed to cover the corresponding antenna diodes so as to remove each of the covered antenna diodes.

10. A method as in claim 1, wherein the excluding of antenna diodes from gate inputs is accomplished by removing antenna diodes from gate inputs with antenna diodes, and wherein, for each gate input in a mask layer with an antenna diode designated for removal, the antenna diode is removed by extracting the antenna diode from the mask layer.

11. A method as in claim 1, wherein the gate inputs are formed in a mask layer, wherein for each gate input with an antenna diode there is an antenna diode substructure, wherein the excluding of antenna diodes from gate inputs with antenna diodes is accomplished by removing the antenna diodes from such gate inputs, and wherein the antenna diodes are removed by removing the substructure of the diodes which are designated for removal.

12. A method for reducing the number of antenna diodes, comprising:

selecting a segment of an interconnect routed in one or more metal layers of an integrated circuit (IC);

determining whether the selected segment is attached to any gate input and, if so, further determining whether the selected segment is connected to a signal source; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and reducing the number of antenna diodes if it is so determined, wherein protection of each gate input is maintained.

13. A method as in claim 12, wherein the criteria include an upper limit for the ratio and a number of the gate inputs that are attached to the selected segment.

14. A method as in claim 13, wherein the upper limit for the ratio is equal to or lower than 50.

15. A method as in claim 13, wherein the ratio is compared to the upper limit so that if the ratio is below the upper limit antenna diodes are excluded from every gate input that is attached to the selected segment.

16. A method as in claim 13, wherein the ratio is compared to the upper limit so that if the ratio is at or exceeds the upper limit, and there is more than one gate input attached to the selected segment, antenna diodes are removed from or, by not being added to, excluded from all but one designated gate input of the gate inputs that are attached to the selected segment.

17. A method as in claim 13, wherein the ratio is compared to the upper limit so that if the ratio is at or exceeds the upper limit, and there is more than one gate input attached to the selected segment, antenna diodes are removed from all but one gate input that is closest to the signal source among the gate inputs that are attached to the selected segment.

18. A method as in claim 13, wherein the ratio is compared to the upper limit so that if the ratio is at or exceeds the upper limit, and there is only one gate input attached to the selected segment, the antenna diode at the gate input is maintained.

19. A method as in claim 12, wherein the number of antenna diodes is reduced by excluding antenna diodes from all the gate inputs that are attached to the selected segment, and wherein the excluding of antenna diodes includes removing the antenna diodes.

20. A method as in claim 12, wherein the number of antenna diodes is reduced by excluding antenna diodes from all but a designated one of the gate inputs that are attached to the selected segment, and wherein the excluding of antenna diodes includes removing the antenna diodes.

21. A method as in claim 20, wherein each of the antenna diodes is associated with a gate input and included in a cell together with the gate input, wherein the removing of the antenna diodes includes:

skipping the cell with the designated gate input; and for each additional cell, with a gate input that is attached to the selected segment and an antenna diode, replacing the cell with a cell that does not have the antenna diode.

22. A method as in claim 13, wherein the number of antenna diodes is reduced by excluding antenna diodes from all but designated gate inputs of the gate inputs that are attached to the selected segment, and wherein the excluding of antenna diodes includes removing the antenna diodes.

23. A method as in claim 22, wherein each of the antenna diodes is associated with a gate input and included in a cell together with the gate input, wherein the removing of the antenna diodes includes:

skipping cells with the designated gate inputs; and for each additional cell, if any, with a gate input that is attached to the selected segment and an antenna diode, replacing the cell with a cell that does not have the antenna diode.

24. A method as in claim 12, wherein the number of antenna diodes is reduced by excluding antenna diodes from all but a designated one of the gate inputs that are attached to the selected segment, the designated gate input being closest to the signal source, and wherein the excluding of antenna diodes includes removing the antenna diodes.

25. A method as in claim 24, wherein each of the antenna diodes is associated with a gate input and included in a cell together with the gate input, wherein the removing of the antenna diodes includes:

skipping cells with the designated gate inputs; and for each additional cell, if any, with a gate input that is attached to the selected segment and an antenna diode, replacing the cell with a cell that does not have the antenna diode.

26. A method as in claim 12, wherein each of the gate inputs is in a cell, wherein an antenna diode can be added to each cell that initially does not have an antenna diode associated with the gate input, wherein the adding of an antenna diode is achieved by replacing each cell that does not have the associated antenna diode with another cell that has the associated antenna diode, and wherein the number of antenna diodes associated with gate inputs that are attached to the selected segment is reduced by reducing the number of antenna diodes to be added to these gate inputs.

27. A method as in claim 12, wherein the number of antenna diodes associated with gate inputs that are attached to the selected segment is reduced by reducing the number of antenna diodes to be added to these gate inputs, and wherein the adding of an antenna diode is achieved by connecting the antenna diode to the selected segment.

28. A method for reducing the number of antenna diodes, comprising:

selecting a segment of an interconnect routed in one or more metal layers of an integrated circuit (IC);

determining whether the selected segment is attached to any gate input and, if so, further determining whether the selected segment is connected to a signal source;

determining whether the selected segment is at the lowest metal layer for the routed interconnect if the selected segment is already connected to a signal source and, if the selected segment is at the lowest metal layer, excluding all antenna diodes from gate inputs that are attached to the selected segment, wherein protection of each gate input is maintained; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and reducing the number of antenna diodes if it is so determined, wherein protection of each gate input is maintained.

29. A computer readable medium embodying computer program code configured to cause a computer system to perform steps for minimizing the number of antenna diodes, comprising:

selecting a segment of an interconnect routed in one or more metal layers of an integrated circuit (IC);

determining whether the selected segment is attached to any gate input and, if so, further determining whether the selected segment is connected to a signal source; and determining whether the selected segment is at the lowest metal layer for the routed interconnect if the selected segment is already connected to a signal source and, if the selected segment is at the lowest metal layer, excluding all antenna diodes from all gate inputs that are attached to the selected segment, wherein protection of each gate input is maintained;

wherein the computer program code causes the computer system to perform further steps, comprising:

determining whether to adjust the number of antenna diodes associated with gate inputs that are attached to the selected segment if the selected segment is not yet connected to the signal source, including:

determining an interconnect area;

determining a gate area;

determining a ratio between the interconnect area and the gate area;

determining, based on criteria including the ratio, whether to reduce to a minimum the number of antenna diodes; and minimizing the number of antenna diodes if it is so determined, wherein protection of each gate input is maintained.

30. A computer readable medium as in claim 29, wherein the criteria include an upper limit for the ratio and a number of the gate inputs that are attached to the selected segment.

31. A computer readable medium embodying computer program code configured to cause a computer system to perform steps for reducing the number of antenna diodes, comprising:

selecting a segment of an interconnect routed in one or more metal layers of an integrated circuit (IC);

determining whether the selected segment is attached to any gate input and, if so, further determining whether the selected segment is connected to a signal source; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and reducing the number of antenna diodes if it is so determined, wherein protection of each gate input is maintained.

32. A computer readable medium embodying computer program code configured to cause a computer system to perform steps for reducing the number of antenna diodes, comprising:

selecting a segment of an interconnect routed in one or more metal layers of an integrated circuit (IC);

determining whether the selected segment is attached to any gate input and, if so, further determining whether the selected segment is connected to a signal source;

determining whether the selected segment is at the lowest metal layer for the routed interconnect if the selected segment is already connected to a signal source and, if the selected segment is at the lowest metal layer, excluding all antenna diodes from all gate inputs that are attached to the selected segment, wherein protection of each gate input is maintained; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and reducing the number of antenna diodes if it is so determined, wherein protection of each gate input is maintained.

33. A system for minimizing the number of antenna diodes, comprising:

a processor; and a storage medium embodying computer program code executed by the processor, including:

a circuit design engine;

a physical data generator; and a diodes number reduction engine capable of:

selecting a segment of an interconnect routed in one or more metal layers of an integrated circuit (IC);

determining whether the selected segment is attached to any gate input and, if so, further determining whether the selected segment is connected to a signal source; and determining whether the selected segment is at the lowest metal layer for the routed interconnect if the selected segment is already connected to a signal source and, if the selected segment is at the lowest metal layer, excluding all antenna diodes from all gate inputs that are attached to the selected segment, wherein protection of each gate input is maintained;

wherein the diodes number reduction engine is further capable of:

determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce to a minimum the number of antenna diodes; and minimizing the number of antenna diodes if it is so determined, wherein protection of each gate input is maintained.

34. A system as in claim 33, wherein the criteria include an upper limit for the ratio and a number of the gate inputs that are attached to the selected segment.

35. A system for reducing the number of antenna diodes, comprising:

a processor; and a storage medium embodying computer program code executed by the processor, including:

a circuit design engine;

a physical data generator; and a diodes number reduction engine capable of:

selecting a segment of an interconnect routed in one or more metal layers of an integrated circuit (IC);

determining whether the selected segment is attached to any gate input and, if so, further determining whether the selected segment is connected to a signal source; and determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and minimizing the number of antenna diodes if it is so determined, wherein protection of each gate input is maintained.

36. An apparatus for minimizing the number of antenna diodes, comprising:

means for selecting a segment of an interconnect routed in one or more metal layers of an integrated circuit (IC);

means for determining whether the selected segment is attached to any gate input and, if so, further determining whether the selected segment is connected to a signal source;

means for determining whether the selected segment is at the lowest metal layer for the routed interconnect if the selected segment is already connected to a signal source and, if the selected segment is at the lowest metal layer, for excluding all antenna diodes from all gate inputs that are attached to the selected segment, wherein protection of each gate input is maintained; and means for determining whether to adjust the number of antenna diodes associated with gate inputs that are attached to the selected segment if the selected segment is not yet connected to the signal source, including:

means for determining an interconnect area;

means for determining a gate area;

means for determining a ratio between the interconnect area and the gate area;

means for determining, based on criteria including the ratio, whether to reduce to a minimum the number of antenna diodes; and means for minimizing the number of antenna diodes if it is so determined, wherein protection of each gate input is maintained.

37. An apparatus as in claim 36, further comprising:

means for selecting, one at a time until all segments of the interconnect at each of the metal layers for the interconnect have been selected, a next segment in a next higher metal layer, and handling each next selected segment individually;

means for selecting, one at a time until all interconnects of a signal route have been selected, a next interconnect routed in one or more of the metal layers if no more segments of the interconnect being dealt with remain to be handled, and individually dealing with each next selected interconnect; and means for selecting, one at a time until all signal routes in the IC have been examined, a next signal route, and examining each signal route individually.

38. An apparatus as in claim 36, wherein the criteria include an upper limit for the ratio and a number of the gate inputs that are attached to the selected segment.

39. An apparatus for reducing the number of antenna diodes, comprising:

means for selecting a segment of an interconnect routed in one or more metal layers of an integrated circuit (IC);

means for determining whether the selected segment is attached to any gate input and, if so, further determining whether the selected segment is connected to a signal source; and means for determining whether to adjust the number of antenna diodes associated with gate inputs that are attached to the selected segment if the selected segment is not connected to the signal source, including:

means for determining an interconnect area;

means for determining a gate area;

means for determining a ratio between the interconnect area and the gate area;

means for determining, based on criteria including the ratio, whether to reduce the number of antenna diodes; and means for minimizing the number of antenna diodes if it is so determined, wherein protection of each gate input is maintained.

40. An integrated circuit (IC), comprising:

gate inputs;

interconnects routed in one or more metal layers of the IC, and attached to at least one of the gate inputs, the interconnects forming signal routes; and gate inputs protection designed with a reduced number of antenna diodes provided by a diodes number reduction engine capable of:

selecting the signal routes one at a time until all signal routes in the IC have been selected;

selecting the interconnects for each selected signal route one at a time until all interconnects of each selected signal route have been selected;

selecting segments of each selected interconnect one at a time until all the segments of each selected interconnect have been selected; and performing steps for each selected segment of:

determining whether the selected segment is attached to any gate input and, if so, further determining whether the selected segment is connected to a signal source; and determining whether the selected segment is at the lowest metal layer for the routed interconnect if the selected segment is already connected to a signal source and, if the selected segment is at the lowest metal layer, for excluding all antenna diodes from all gate inputs that are attached to the selected segment, wherein protection of each gate input is maintained;

wherein, for each selected segment, the diodes number reduction engine is further capable of:

determining whether to adjust the number of antenna diodes associated with gate inputs that are attached to the selected segment if the selected segment is not connected to the signal source, including:

determining an interconnect area;

determining a gate area;

determining a ratio between the interconnect area and the gate area;

determining, based on criteria including the ratio, whether to reduce the number of antenna diodes; and reducing the number of antenna diodes if it is so determined, wherein protection of each gate input is maintained.

41. An IC as in claim 40, wherein the gate inputs are provided by a circuit design engine, physical data generator and placement tool, and wherein the interconnects are routed by a placement and routing tool.

42. An integrated circuit (IC), comprising:

gate inputs;

interconnects routed in one or more metal layers of the IC, and attached to at least one of the gate inputs, the interconnects forming signal routes; and gate inputs protection designed with a reduced number of antenna diodes provided by a diodes number reduction engine capable of:

selecting the signal routes one at a time until all signal routes in the IC have been selected;

selecting the interconnects for each selected signal route one at a time until all interconnects of each selected signal route have been selected;

selecting segments of each selected interconnect one at a time until all the segments of each selected interconnect have been selected; and performing steps for each selected segment of:
  determining whether the selected segment is attached to any gate input and, if so, further determining whether the selected segment is connected to a signal source; and
  determining whether to adjust the number of antenna diodes associated with gate inputs that are attached to the selected segment if the selected segment is not connected to the signal source, including:
    determining an interconnect area;
    determining a gate area;
    determining a ratio between the interconnect area and the gate area;
    determining, based on criteria including the ratio, whether to reduce the number of antenna diodes; and
    reducing the number of antenna diodes if it is so determined, wherein protection of each gate input is maintained.

43. An IC as in claim 42, wherein the gate inputs are provided by a circuit design engine, physical data generator and placement tool, and wherein the interconnects are routed by a placement and routing tool.

* * * * *

UNITED STATES PATENT AND TRADEMARK OFFICE
CERTIFICATE OF CORRECTION

PATENT NO. : 6,389,584 B1
DATED : May 14, 2002
INVENTOR(S) : Takeshi Kitahara

It is certified that error appears in the above-identified patent and that said Letters Patent is hereby corrected as shown below:

<u>Column 15,</u>
Line 33, change "for each additional cell, with a gate input that is attached" to
-- for each additional cell, if any, with a gate input that is attached --

Signed and Sealed this

Eleventh Day of March, 2003

JAMES E. ROGAN
*Director of the United States Patent and Trademark Office*